US012700369B2

(12) United States Patent
Yan et al.

(10) Patent No.: US 12,700,369 B2
(45) Date of Patent: Aug. 4, 2026

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Zhuoran Yan, Beijing (CN); Ni Yang, Beijing (CN); Yuanjie Xu, Beijing (CN); Lili Du, Beijing (CN); Yudiao Cheng, Beijing (CN); Qiwei Wang, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 19/192,530

(22) Filed: Apr. 29, 2025

(65) Prior Publication Data

US 2025/0279060 A1     Sep. 4, 2025

Related U.S. Application Data

(63) Continuation of application No. 18/267,555, filed as application No. PCT/CN2022/098715 on Jun. 14, 2022, now Pat. No. 12,327,524.

(51) Int. Cl.
*G09G 3/3258* (2016.01)
*H10K 59/121* (2023.01)
*H10K 59/131* (2023.01)

(52) U.S. Cl.
CPC ....... *G09G 3/3258* (2013.01); *H10K 59/1213* (2023.02); *H10K 59/131* (2023.02);
(Continued)

(58) Field of Classification Search
CPC ... G09G 3/30–3291; G09G 2320/0233; G09G 2300/0413; G09G 2300/0426;
(Continued)

(56) References Cited

U.S. PATENT DOCUMENTS

2018/0174525 A1* 6/2018 Kim ..................... G09G 3/3291
2022/0231113 A1* 7/2022 Xu ....................... H10K 59/131

FOREIGN PATENT DOCUMENTS

CN        113497093 A     10/2021
KR    1020180071466 A     6/2018

OTHER PUBLICATIONS

Korean Office Action in Korean Application No. 10-2024-7019489 dated Jan. 27, 2026 with English tranlsation.

* cited by examiner

*Primary Examiner* — Hang Lin
(74) *Attorney, Agent, or Firm* — Collard & Roe, P.C.; William Collard

(57) ABSTRACT

A display substrate includes a first display region and a second display region located at at least one side of the first display region, a light transmittance of the first display region is greater than that of the second display region. The first display region is provided with first light emitting devices, the second display region is provided with first pixel driving circuits, second pixel driving circuits, and second light emitting devices. The first pixel driving circuit drives the first light emitting device, and the second pixel driving circuit drives the second light emitting device. The second display region further includes initialization signal lines respectively connected with the first pixel driving circuits and the second pixel driving circuits and apply initialization signals thereto. The first pixel driving circuit (Continued)

10 and the second pixel driving circuit are respectively connected to different initialization signal lines.

20 Claims, 15 Drawing Sheets

(52) U.S. Cl.
CPC ............... *G09G 2300/0413* (2013.01); *G09G 2300/0426* (2013.01); *G09G 2300/043* (2013.01); *G09G 2300/0842* (2013.01); *G09G 2300/0861* (2013.01); *G09G 2320/0233* (2013.01)

(58) Field of Classification Search
CPC ..... G09G 2300/043; G09G 2300/0842; G09G 2300/0861; G09G 2310/0251; H10K 59/1213; H10K 59/131; H10K 59/121; H10K 59/58
See application file for complete search history.

10

10

200

200

510

521

522

CE1

520

523

530

310/310c

531

CE2

320

H1

310/310b

540

H2

600

DISPLAY SUBSTRATE AND DISPLAY DEVICE

CROSS REFERENCE TO RELATED APPLICATIONS

This application is a continuation application of U.S. Ser. No. 18/267,555 filed on Jun. 15, 2023 which is a national stage application of international application PCT/CN2022/098715 filed on Jun. 14, 2022, the disclosure of which are incorporated by references.

TECHNICAL FIELD

Embodiments of the present disclosure relate to a display substrate and a display device.

BACKGROUND

With the continuous development of display technology, organic light emitting diode (OLED) display technology has been increasingly applied in various electronic products because of its advantages such as self-luminescence, wide viewing angle, high contrast, low power consumption and high response speed.

On the other hand, people have increasingly higher requirements for the screen-to-body ratio of display devices such as smart phones and tablet computers. The design of setting some functional components of these display devices under the screen has become a new research hotspot. For example, in the design of full display camera (FDC), the camera of the display device is set under the screen, so as to achieve an ultra-high screen-to-body ratio.

SUMMARY

Embodiments of the present disclosure provide a display substrate and a display device. By connecting a first pixel driving circuit in a first display region and a second pixel driving circuit in a second display region to different initialization signal lines, different initialization signals can be applied to the first light emitting device and the second light emitting device, so that the display difference between the first display region and the second display region can be reduced, and the display effect can be further improved.

At least one embodiment of the present disclosure provides a display substrate including a first display region and a second display region located at at least one side of the first display region, wherein a light transmittance of the first display region is greater than that of the second display region; the first display region is provided with a plurality of first light emitting devices arranged in an array along a first direction and a second direction crossing with each other, the second display region is provided with a plurality of first pixel driving circuits and a plurality of second pixel driving circuits arranged in an array along the first direction and the second direction, and the second display region is further provided with a plurality of second light emitting devices; the first pixel driving circuit is configured to drive the first light emitting device, and the second pixel driving circuit is configured to drive the second light emitting device; the second display region further includes a plurality of initialization signal lines respectively connected to the plurality of first pixel driving circuits and the plurality of second pixel driving circuits and configured to apply initialization signals to the first light emitting device and the second light emitting device; and the first pixel driving circuit and the second pixel driving circuit are respectively connected to different initialization signal lines.

For example, in the display substrate provided by an embodiment of the present disclosure, the first pixel driving circuit and the second pixel driving circuit located in a same row are connected to different initialization signal lines; and/or the first pixel driving circuit and the second pixel driving circuit located in a same column are connected to different initialization signal lines.

For example, in the display substrate provided by an embodiment of the present disclosure, different initialization signal lines respectively connected to the first pixel driving circuit and the second pixel driving circuit are configured to be driven independently.

For example, in the display substrate provided by an embodiment of the present disclosure, the second display region includes a plurality of dummy rows and a plurality of dummy columns, a plurality of normal rows are arranged between every two adjacent dummy rows and a plurality of normal columns are arranged between every two adjacent dummy columns, the plurality of first pixel driving circuits are located in the plurality of dummy rows or the plurality of dummy columns, and the plurality of second pixel driving circuits are located in the plurality of normal rows and the plurality of normal columns.

For example, in the display substrate provided by an embodiment of the present disclosure, the plurality of initialization signal lines include a first initialization signal line connected to the first pixel driving circuit; the plurality of initialization signal lines further include a second initialization signal line extending along the first direction and connected to the second pixel driving circuit located in a same row.

For example, in the display substrate provided by an embodiment of the present disclosure, an orthographic projection of a portion of the first initialization signal line extending in the first direction on the display substrate is located in orthographic projections of the plurality of dummy rows on the display substrate; and/or an orthographic projection of a portion of the first initialization signal line extending in the second direction on the display substrate is located in orthographic projections of the plurality of dummy columns on the display substrate.

For example, in the display substrate provided by an embodiment of the present disclosure, the second display region includes a first display sub-region located at at least one side of the first display region in the first direction, and at least part of the plurality of first pixel driving circuits are arranged in the first display sub-region; the first initialization signal line includes a first sub-portion located at a side of the first display sub-region away from the first display region, a second sub-portion located in the first display sub-region, and a connection portion connecting the first sub-portion and the second sub-portion.

For example, in the display substrate provided by an embodiment of the present disclosure, the first sub-portion and the second sub-portion extend in the second direction, and the connection portion extends in the first direction.

For example, in the display substrate provided by an embodiment of the present disclosure, the connection portion and the second initialization signal line are located in a same layer, and the first sub-portion and the second sub-portion are located in different layers from the second initialization signal line.

For example, in the display substrate provided by an embodiment of the present disclosure, the first sub-portion is located in the dummy column of the first display sub-region away from the first display region, the second subsection is located in the dummy column within the first display sub-region, and the connection portion is located in the dummy row.

For example, in the display substrate provided by an embodiment of the present disclosure, the second sub-portion is connected to the first pixel driving circuit located in the first display sub-region and located in a same column.

For example, in the display substrate provided by an embodiment of the present disclosure, the second display region includes a second display sub-region located at at least one side of the first display region in the second direction, and at least part of the plurality of first pixel driving circuits are arranged in the second display sub-region; the first initialization signal line includes a third sub-portion located at an outside of the second display sub-region and a fourth sub-portion extending from the outside of the second display sub-region into the second display sub-region; and the third sub-portion extends in the second direction, and the fourth sub-portion extends in the first direction.

For example, in the display substrate provided by an embodiment of the present disclosure, the third sub-portion is located in the dummy column, and the fourth sub-portion is located in the dummy row.

For example, in the display substrate provided by an embodiment of the present disclosure, the fourth sub-portion and the second initialization signal line are located in a same layer; and the third sub-portion and the second initialization signal line are located in different layers.

For example, the display substrate provided by an embodiment of the present disclosure further includes a data signal line arranged in the normal column and extending in the second direction, wherein the data signal line is configured to apply a data signal to the second pixel driving circuit, and the first sub-portion of the first initialization signal line is arranged in a same layer as the data signal line.

For example, in the display substrate provided by an embodiment of the present disclosure, the first sub-portion of the first initialization signal line and the connection portion are connected through a via hole, and the connection portion and the second sub-portion are located in different layers and connected through a via hole.

For example, the display substrate provided by an embodiment of the present disclosure further includes a data signal line arranged in the normal column and extending in the second direction, wherein the data signal line is configured to apply a data signal to the second pixel driving circuit, and the third sub-portion of the first initialization signal line is arranged in a same layer as the data signal line.

For example, in the display substrate provided by an embodiment of the present disclosure, the third sub-portion and the fourth sub-portion of the first initialization signal line are connected through a via hole.

For example, in the display substrate provided by an embodiment of the present disclosure, the first pixel driving circuit in the first display sub-region is arranged in the dummy column, and the first pixel driving circuit in the dummy column is connected to the corresponding first light emitting device located in the first display region through a driving connection line extending in the first direction.

For example, in the display substrate provided by an embodiment of the present disclosure, the first pixel driving circuit in the second display sub-region is arranged in the dummy row, and the first pixel driving circuit in the dummy row is connected to the corresponding first light emitting device in the first display region through a driving connection line extending in the second direction.

For example, in the display substrate provided by an embodiment of the present disclosure, the first pixel driving circuit includes a first initialization transistor electrically connected to an electrode of the corresponding first light emitting device, so as to be configured to apply an initialization signal to the electrode; the second pixel driving circuit includes a second initialization transistor electrically connected to an electrode of the corresponding second light emitting device, so as to be configured to apply an initialization signal to the electrode of the second light emitting device.

For example, in the display substrate provided by an embodiment of the present disclosure, the first initialization signal line is electrically connected to one of a source electrode and a drain electrode of the first initialization transistor, and the other of the source electrode and the drain electrode of the first initialization transistor is electrically connected to the electrode of the first light emitting device; the second initialization signal line is electrically connected to one of a source electrode and a drain electrode of the second initialization transistor, and the other of the source electrode and the drain electrode of the second initialization transistor is electrically connected to the electrode of the second light emitting device.

Embodiments of the present disclosure further provide a display device, including any display substrate described above.

For example, the display device provided by an embodiment of the present disclosure further includes a functional device located on a non-display side of the display substrate, wherein the functional device is configured to emit light to a display side of the display substrate through the first display region and/or receive light transmitted from the display side of the display substrate to the non-display side of the display substrate through the first display region.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of present disclosure.

DETAILED DESCRIPTION

Figure 1A:
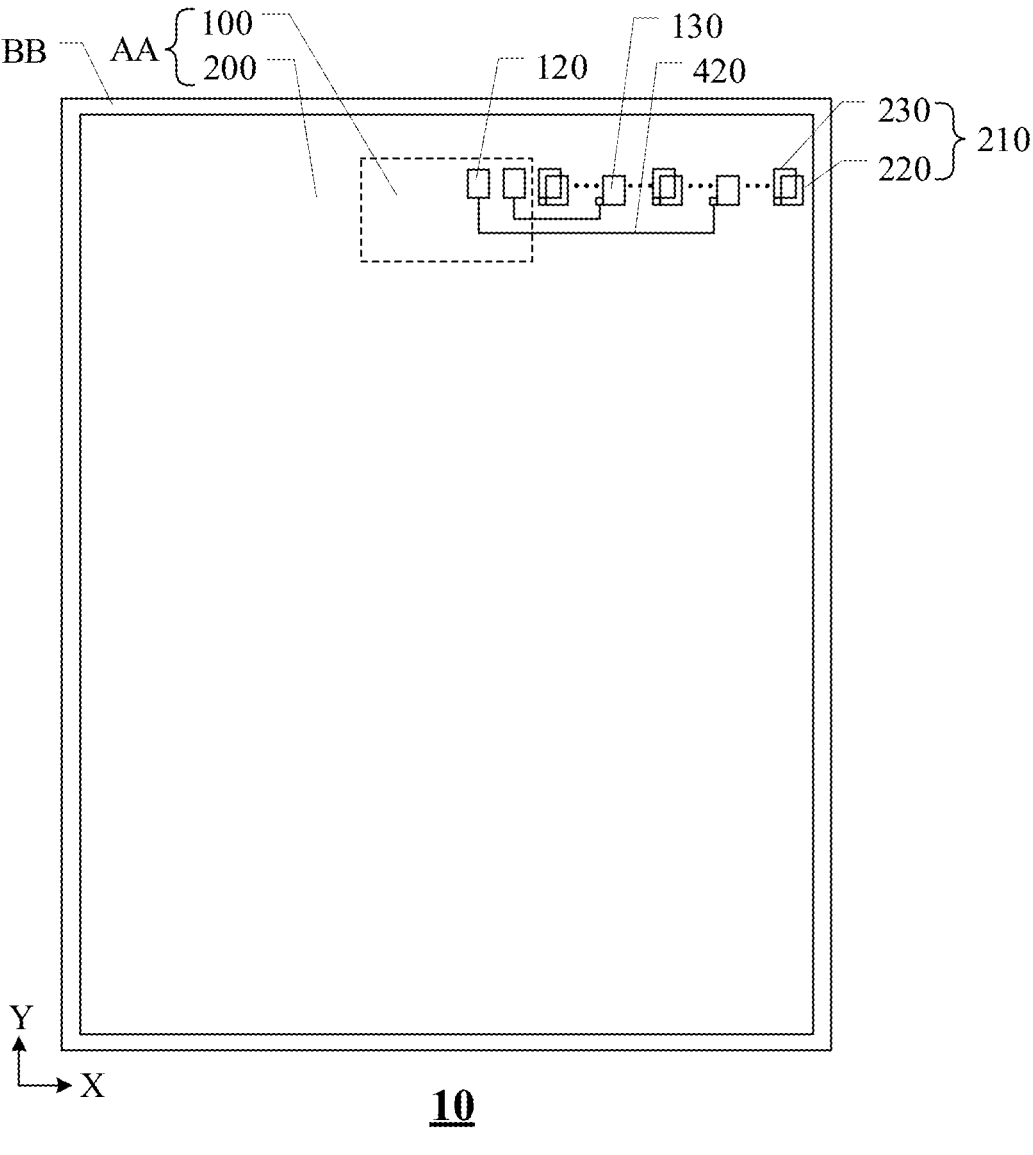
FIG. 1A is a schematic plan view of a display substrate provided by some embodiments of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect.

Features such as "vertical", "parallel" and "identical" used in the embodiments of the present disclosure all include features such as "vertical", "parallel" and "identical" in a strict sense, and cases such as "approximately vertical", "approximately parallel" and "approximately identical" containing certain errors, which is intended to be within an acceptable deviation range for a specific value determined by a person skilled in the art, by considering the measurement and the errors related to a specific number of measurements (that is, the limitations of the measurement system). The "center" in the embodiments of the present disclosure may include a strictly geometric center position and a roughly central position in a small area around the geometric center. For example, "approximately" may refer to be located within one or more standard deviations, or within 10% or 5% of the stated value.

With the increase of consumers' requirements for the integrity of display screens, the off-screen camera is becoming more and more popular. For example, the display screen can be divided into a light-transmitting display region and a normal display region located at at least one side of the light-transmitting display region, and the camera can be arranged in the light-transmitting display region, for example, the camera can be arranged at a side opposite to a light emitting side of the display screen, so that image light passing through the light-transmitting display region can be taken by the camera. At present, in the field of OLED, in order to meet the requirements of high resolution or high pixel per inch (PPI) display in the light-transmitting display region, only light emitting devices are reserved in the light-transmitting display region, and part of pixel driving circuits thereof are placed in the normal display region, and then the light emitting devices in the light-transmitting display region and their corresponding pixel driving circuits are connected through transparent conductive oxide materials to realize the driving of the light emitting devices. For example, the pixel driving circuit in the normal display region can be compressed to leave room for the pixel driving circuit in the light-transmitting display region, and then the light emitting device in the light-transmitting display region can be connected to its corresponding pixel driving circuit through indium tin oxide (ITO) to realize the driving of the light emitting device. At the same time, in order to improve the transmittance of the light-transmitting display region, a light emitting area of the light emitting device will also be made smaller, which is different from a light emitting area of the light emitting device in the normal display region. Therefore, the pixel driving circuit for driving the light emitting device in the light-transmitting display region is placed in the normal display region, and the light emitting area of the light emitting device in the light-transmitting display region is different from that of the light emitting device in the normal display region, so that the light-transmitting display region and the normal display region of the display screen have different display effects.

In this regard, an embodiment of the present disclosure provides a display substrate and a display device. The display substrate includes a first display region and a second display region located at at least one side of the first display region, and a light transmittance of the first display region is greater than that of the second display region. The first display region is provided with a plurality of first light emitting devices arranged in an array along a first direction and a second direction which cross with each other, and the second display region is provided with a plurality of first pixel driving circuits and a plurality of second pixel driving circuits arranged in an array along the first direction and the second direction, and the second display region is further provided with a plurality of second light emitting devices. The first pixel driving circuit is configured to drive the first light emitting device, and the second pixel driving circuit is configured to drive the second light emitting device. The second display region further includes a plurality of initialization signal lines respectively connected to the plurality of first pixel driving circuits and the plurality of second pixel driving circuits and configured to apply initialization signals to the first light emitting device and the second light emitting device. The first pixel driving circuit and the second pixel driving circuit are respectively connected to different initialization signal lines. Therefore, by connecting the first pixel driving circuit in the first display region and the second pixel driving circuit in the second display region to different initialization signal lines, different initialization signals can be applied to the first light emitting device and the second light emitting device, so that the display difference between the first display region and the second display region can be reduced, and the display effect can be further improved.

Hereinafter, the display substrate and the display device provided by the embodiments of the present disclosure will be described in detail with reference to the accompanying drawings.

Figure 1B:
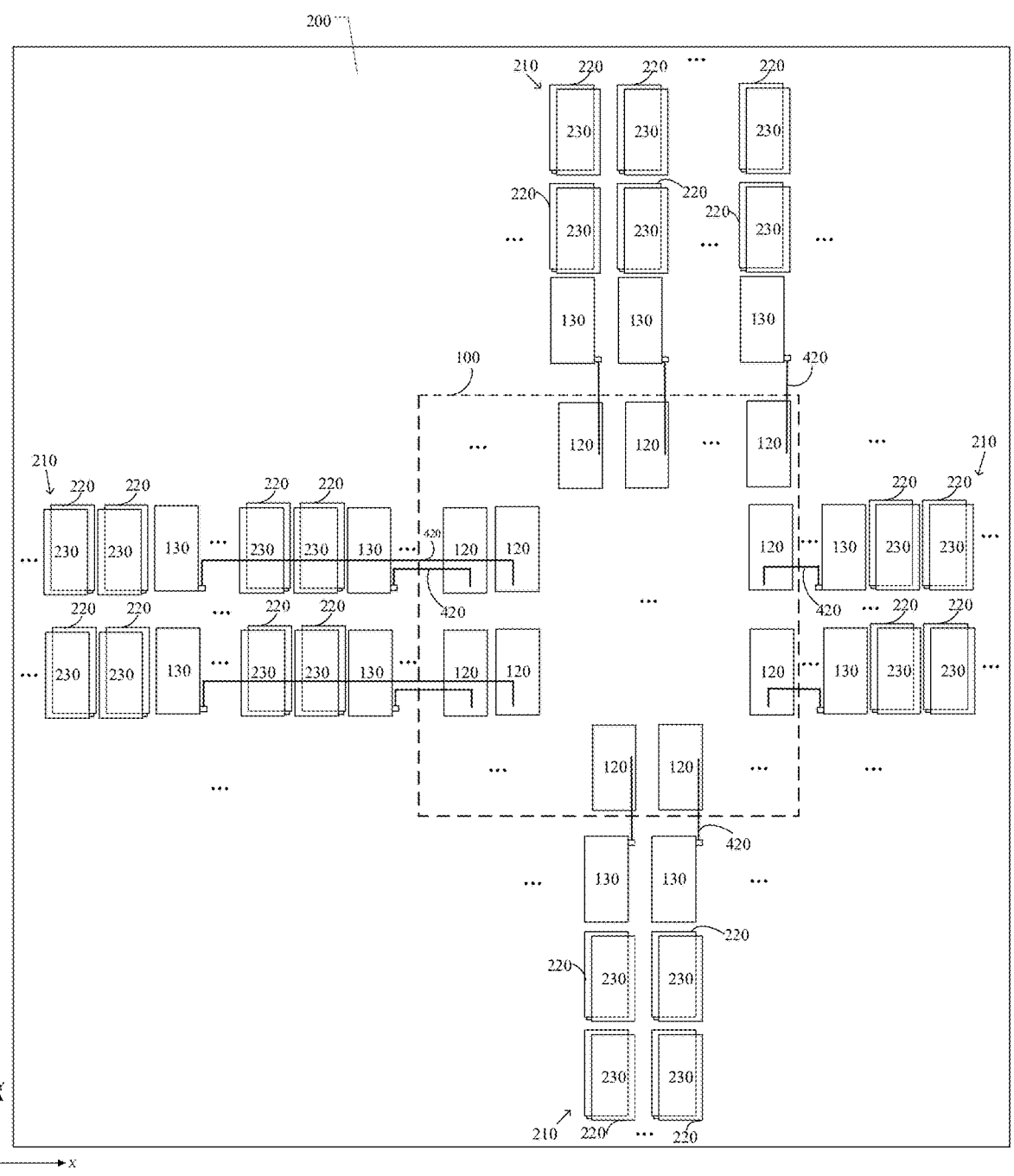
FIG. 1B is a partial plan view of the display substrate in FIG. 1A.

FIG. 1A is a schematic plan view of a display substrate provided by some embodiments of the present disclosure; FIG. 1B is a partial plan view of the display substrate in FIG. 1A.

As illustrated in FIGS. 1A and 1B, the display substrate 10 may include a display region AA and a peripheral region BB. The peripheral region BB is a non-display region. The display region AA of the display substrate 10 includes a first display region 100 and a second display region 200 located at at least one side of the first display region 100. A light transmittance of the first display region 100 is greater than that of the second display region 200. For example, the first display region 100 may be a light-transmitting display region, so that other optical functional devices such as an off-screen camera, an optical sensor, etc. may be arranged at a position corresponding to the first display region 100. In addition, it should be noted that the light transmittance of the second display region 200 can be zero or a non-zero value. For example, the light transmittance here may refer to a transmittance of light used by the above-mentioned optical functional devices such as visible light and infrared light.

In some examples, as illustrated in FIGS. 1A and 1B, the second display region 200 may be located at at least one side of the first display region 100. For example, the second display region 200 may surround the first display region 100. That is to say, the first display region 100 may be surrounded by the second display region 200. For example, the first display region 100 may be located at other positions, for example, at the middle position near the top edge of the display substrate 10, or at the upper left corner position or the upper right corner position of the display substrate 10. Embodiments of the present disclosure are not limited thereto. As illustrated in FIGS. 1A and 1B, the first display region 100 is provided with a plurality of first light emitting devices 120 arranged in an array along a first direction X and a second direction Y that cross with each other, and the second display region 200 is provided with a plurality of first pixel driving circuits 130 and a plurality of second pixel driving circuits 230 arranged in an array along the first direction X and the second direction Y. In addition, the second display region 200 is further provided with a plurality of second light emitting devices 220. The first pixel driving circuit 130 is configured to drive the first light emitting device 120, and the second pixel driving circuit 230 is configured to drive the second light emitting device 220. The second pixel driving circuit 230 and the second light emitting device 220 driven by the second pixel driving circuit 230 form a light emitting unit 210.

It should be noted that orthographic projections of the second light emitting device 220 and the corresponding second pixel driving circuit 230 in the second display region 200 on the display substrate may be at least partially overlapped. In some embodiments, an orthographic projection of the second light emitting device 220 on the display substrate may also be at least partially overlapped with an orthographic projection of the first pixel driving circuit 130 adjacent to the second light emitting device 220 on the display substrate. In order to increase the light emitting area, the plurality of second light emitting devices 220 disposed in the second display region 200 may occupy as large an area as possible in the second display region 200. The arrangement of the plurality of second light emitting devices 220 in the second display region 200 is not particularly limited according to the embodiments of the present disclosure.

For example, as illustrated in FIGS. 1A and 1B, the first pixel driving circuit 130 is connected to the first light emitting device 120 to drive the first light emitting device 120, and the second pixel driving circuit 230 is connected to the second light emitting device 220 to drive the second light emitting device 220. For example, the plurality of first light emitting devices 120 arranged in an array along the first direction X and the second direction Y in the first display region 100 may be connected to the plurality of first pixel driving circuits 130 in the second display region 200 through driving connection lines 420, respectively. For example, the driving connection line 420 may extend in the first direction X or the second direction Y. For example, the driving connection line 420 may also extend in a direction with a certain inclination angle relative to the first direction X or the second direction Y (i.e., obliquely). For example, the driving connection line 420 may also be a bent line composed of the driving connection lines 420 extending in at least two different directions. Embodiments of the present disclosure are not intended to limit the routing manner of the driving connection line 420.

For example, a material of the driving connection line 420 is transparent conductive oxide, such as indium tin oxide (ITO). Therefore, in a case that the driving connection line 420 is connected to the first display region 100, the light transmittance of the first display region 100 will not be affected.

For example, the first pixel driving circuit 130 and the first light emitting device 120 connected to each other may form a first display sub-pixel, and the light emitting unit 210 forms a second display sub-pixel. Both the first display sub-pixel and the second display sub-pixel may be color sub-pixels, including, for example, red sub-pixels, green sub-pixels and blue sub-pixels. However, embodiments according to the present disclosure are not limited thereto, and they may also be display sub-pixels of other colors. The differences between the first display sub-pixel and the second display sub-pixel include that orthographic projections of the first pixel driving circuit 130 and the first light emitting device 120 of the first display sub-pixel on the display substrate are separated from each other, while orthographic projections of the second pixel driving circuit 230 and the second light emitting device 220 of the second display sub-pixel on the display substrate can be at least partially overlapped.

For example, the plurality of first pixel driving circuits 130 and the plurality of second pixel driving circuits 230 are arranged in a staggered manner, wherein the plurality of first pixel driving circuits 130 can be disposed at some array positions arranged along the first direction and the second direction, while the plurality of second pixel driving circuits 230 are disposed at some other array positions arranged along the first direction and the second direction. It should be noted that the plurality of second pixel driving circuits 230 and the plurality of first pixel driving circuits 130 may not fill all the positions of the two-dimensional array arranged along the first direction and the second direction, and some positions may be left empty or provided with other elements or structures. An example of the arrangement of the first pixel driving circuit 130 and the second pixel driving circuit 230 will be described in more detail below.

For example, the first light emitting device 120 and the second light emitting device 220 may be light emitting devices that emit colored light or light emitting devices that emit white light. For example, the first light emitting device 120 and the second light emitting device 220 may include an anode, a cathode, and a light emitting layer between the anode and the cathode. For example, the first light emitting device 120 and the second light emitting device 220 may be organic light emitting diodes, then the light emitting layer may be an organic light emitting layer. In addition, the first light emitting device 120 and the second light emitting device 220 may further include auxiliary functional film layers such as an electron transport layer, an electron injection layer, a hole transport layer, and a hole injection layer. Embodiments of the present disclosure are not intended to particularly limit the types and specific structures of the light emitting devices, and any suitable light emitting devices can be adopted.

For example, the first pixel driving circuit 130 and the second pixel driving circuit 230 are respectively connected to the first light emitting device 120 and the second light emitting device 220 to drive the light emitting devices. Embodiments of the present disclosure are not intended to particularly limit the specific structures and types of the pixel driving circuits, so any suitable pixel driving circuit can be adopted. Herein, the pixel driving circuit of 7T1C is described as an example. For example, the first pixel driving circuit 130 and the second pixel driving circuit 230 have the same equivalent circuit structure.

Figure 2:
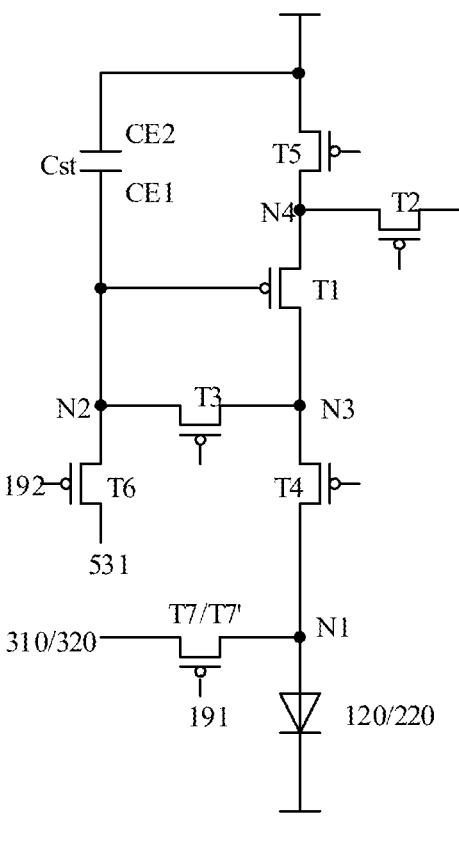
FIG. 2 is an equivalent circuit diagram of a first pixel driving circuit and a second pixel driving circuit in a display substrate provided by some embodiments of the present disclosure.

FIG. 2 is an equivalent circuit diagram of a first pixel driving circuit and a second pixel driving circuit in a display substrate provided by some embodiments of the present disclosure.

For example, as illustrated in FIG. 2, the first pixel driving circuit 130 and the second pixel driving circuit 230 include a driving transistor T1, a data writing transistor T2, a compensation transistor T3, a first light emission control transistor T4, a second light emission control transistor T5, a third initialization transistor T6 for initializing a gate of the driving transistor T1, and a storage capacitor Cst. In addition, the first pixel driving circuit 130 and the second pixel driving circuit 230 further include initialization transistors that initialize the first light emitting device 120 and the second light emitting device 220, respectively. For example, the initialization transistor is used to apply initialization signals to pixel electrodes (e.g., anodes) of the first light emitting device 120 and the second light emitting device 220. For convenience of description, the initialization transistor of the first pixel driving circuit 130 for initializing the first light emitting device 120 is referred to as a first initialization transistor T7, and the initialization transistor of the second pixel driving circuit 230 for initializing the second light emitting device 220 is referred to as a second initialization transistor T7'. However, it should be noted that the first pixel driving circuit 130 and the second pixel driving circuit 230 are named separately for convenience of description, which does not mean that their structures are necessarily different. The first pixel driving circuit 130 and the second pixel driving circuit 230 may have the same structure or different structures. Similarly, the naming of the first initialization transistor T7 and the second initialization transistor T7' is for convenience of description, which does not mean that their structures are necessarily different. The first initialization transistor T7 and the second initialization transistor T7' may have the same structure or different structures.

A first electrode of the first initialization transistor T7 or the second initialization transistor T7' and a first electrode of the first light emission control transistor T4 are connected to a first node N1; a first electrode of the third initialization transistor T6 and a first electrode of the compensation transistor T3 are connected to a second node N2; and the gate of the driving transistor T1 is electrically connected to a first electrode plate CE1 of the storage capacitor Cst; the third initialization transistor T6 can simultaneously provide a third initialization signal Vinit3 to the gate of the driving transistor T1 and the first electrode plate CE1 of the storage capacitor Cst through the second node N2, so that the gate of the driving transistor T1 and the first electrode plate CE1 of the storage capacitor Cst can be initialized. A first electrode of the driving transistor T1, a second electrode of the first light emission control transistor T4 and a second electrode of the compensation transistor T3 are connected to a third node N3; and a second electrode of the driving transistor T1, a first electrode of the data writing transistor T2 and a first electrode of the second light emission control transistor T5 are connected to a fourth node N4. A second electrode of the second light emission control transistor T5 and a second electrode plate CE2 of the storage capacitor Cst are respectively connected to the power supply line.

Next, an operation mode of the first pixel driving circuit 130 will be described schematically. Firstly, a reset signal is transmitted to a gate of the first initialization transistor T7 through a first reset signal line 191 and the first initialization transistor T7 is turned on; and a first initialization signal Vinit1 is applied to a second electrode of the first initialization transistor T7 through the first initialization signal line 310. In this situation, the residual current of the anode of the first light emitting device 120 is discharged through the first initialization transistor T7, so that light emission due to the residual current on the anode of the light emitting element can be suppressed.

Subsequently, a reset signal is transmitted to a gate of the third initialization transistor T6 through a second reset signal line 192 and the third initialization transistor T6 is turned on, then a third initialization signal Vinit3 is applied to a second electrode of the third initialization transistor T6 through the third initialization signal line 531. In this situation, the third initialization signal Vinit3 may be applied to the gate of the driving transistor T1 and the first electrode plate CE1 of the storage capacitor Cst through the third initialization transistor T6, so that the gate of the driving transistor T1 and the first electrode plate CE1 of the storage capacitor Cst are initialized.

For example, the operation mode of the second pixel driving circuit 230 is as same as the operation mode of the first pixel driving circuit 130, which will not be described in detail here.

For example, as illustrated in FIG. 2, the first pixel driving circuit 130 includes the first initialization transistor T7 which is electrically connected to an electrode of the corresponding first light emitting device 120 to be configured to apply a first initialization signal Vinit1 to the electrode, so that the electrode of the first light emitting device 120 can be initialized. For example, the electrode of the first light emitting device 120 connected to the first initialization transistor T7 here is a pixel electrode. In some examples, the pixel electrode is an anode of a light emitting device, but embodiments according to the present disclosure are not limited thereto, and the pixel electrode may also be a cathode of the light emitting device.

For example, as illustrated in FIG. 2, the first initialization signal line 310 is electrically connected to one of a source electrode and a drain electrode of the first initialization transistor T7, and the other of the source electrode and drain electrode of the first initialization transistor T7 is electrically connected to the electrode of the first light emitting device 120.

For example, as illustrated in FIG. 2, the first initialization transistor T7 applies the first initialization signal Vinit1 to the anode of the first light emitting device 120 through the first node N1, thereby initializing the anode of the first light emitting device 120.

For example, as illustrated in FIG. 2, the second pixel driving circuit 230 includes the second initialization transistor T7′, which is electrically connected to an electrode of the corresponding second light emitting device 220 to be configured to apply a second initialization signal Vinit2 to the electrode of the second light emitting device 220, so that the electrode of the second light emitting device 220 can be initialized. For example, the electrode of the second light emitting device 220 connected to the second initialization transistor T7′ here is a pixel electrode. In some examples, the pixel electrode is an anode of a light emitting device, but embodiments according to the present disclosure are not limited thereto, and the pixel electrode may also be a cathode of the light emitting device.

For example, as illustrated in FIG. 2, the second initialization signal line 320 is electrically connected to one of a source electrode and a drain electrode of the second initialization transistor T7′, and the other of the source electrode and drain electrode of the second initialization transistor T7′ is electrically connected to the electrode of the second light emitting device 220.

For example, as illustrated in FIG. 2, the second initialization transistor T7′ is configured to apply the second initialization signal Vinit2 to the anode of the second light emitting device 220 through the first node N1, thereby initializing the anode of the second light emitting device 220.

In the above embodiments, the pixel driving circuit of 7T1C is described as an example, however, embodiments according to the present disclosure are not limited thereto. For example, the first pixel driving circuit 130 or the second pixel driving circuit 230 may also have a 3T1C (i.e., three transistors and one capacitor) structure, a 5T1C (i.e., five transistors and one capacitor) structure, an 8T1C (i.e., eight transistors and one capacitor) structure or an 8T2C (i.e., eight transistors and two capacitors) structure, etc.

It should be noted that the transistor used in the embodiments of the present disclosure can be a triode, a thin film transistor or a field effect transistor or other similar transistors. In the present disclosure, in order to distinguish the two electrodes of the transistor except the control electrode, one of these two electrodes is referred to as the first electrode and the other is referred to as the second electrode. For example, if the transistor is a triode, the first electrode can be a collector and the second electrode can be an emitter; if the transistor is a thin film transistor or a field effect transistor, the first electrode can be a drain electrode and the second electrode can be a source electrode. Of course, the embodiments of the present disclosure include but are not limited thereto, and the types of electrodes indicated by the first electrode and the second electrode can be interchanged.

Figure 3A:
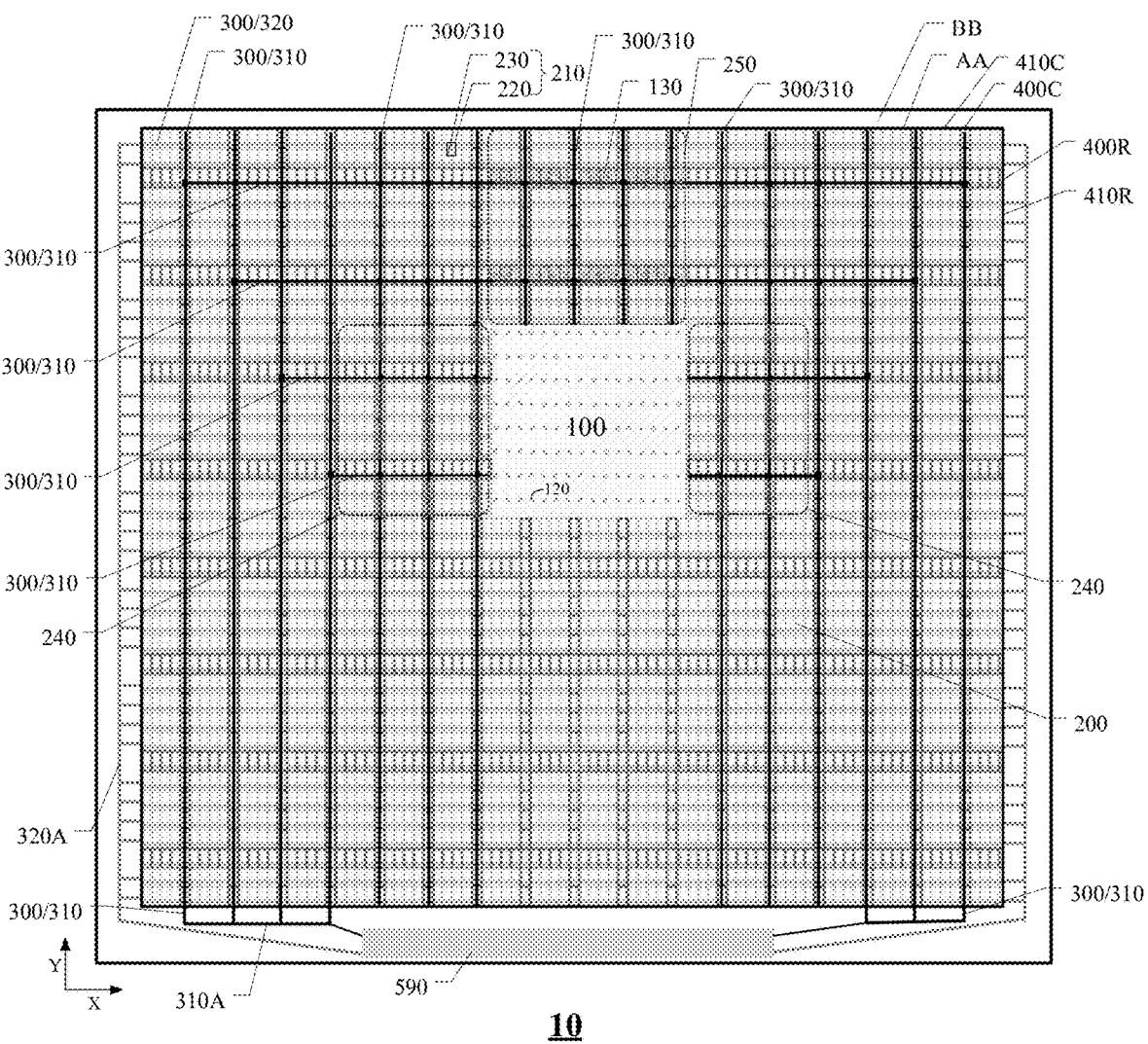
FIG. 3A is a schematic plan view of another display substrate provided by some embodiments of the present disclosure.
Figure 3B:
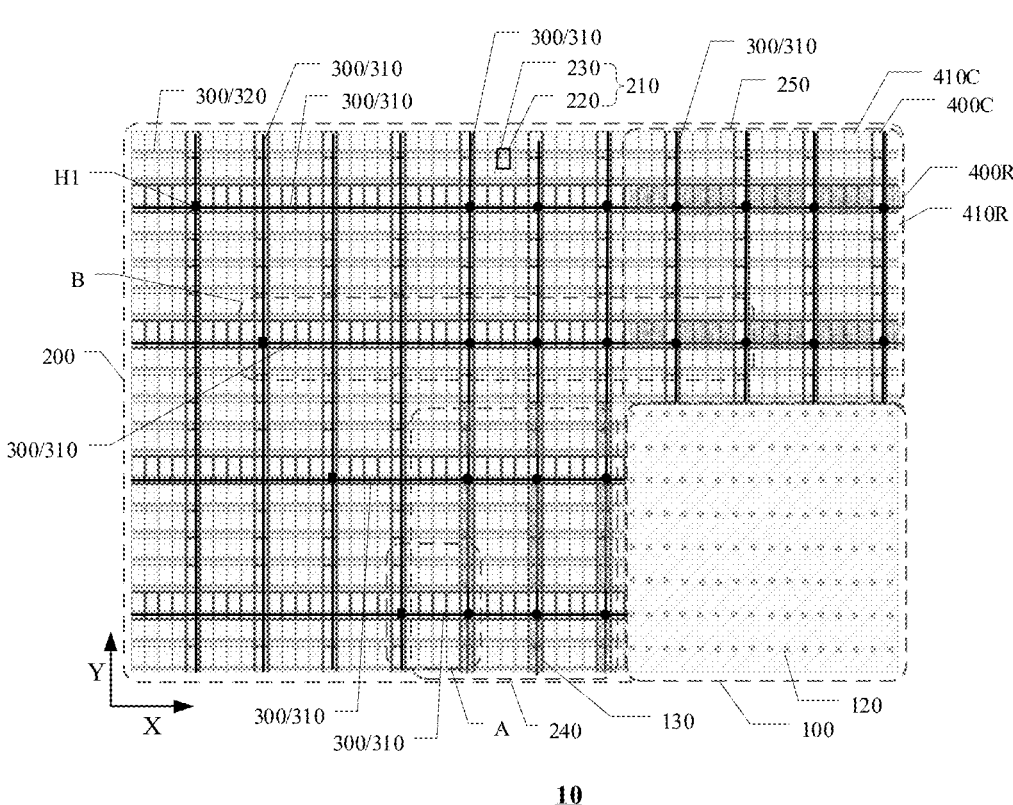
FIG. 3B is a partial plan view of the display substrate in FIG. 3A.

FIG. 3A is a schematic plan view of another display substrate provided by some embodiments of the present disclosure; FIG. 3B is a partial plan view of the display substrate in FIG. 3A. As illustrated in FIGS. 3A and 3B, the display substrate may include a display region AA and a peripheral region BB. The display region AA of the display substrate 10 includes a first display region 100 and a second display region 200 located around the first display region As illustrated in FIGS. 3A and 3B, the first display region 100 is provided with a plurality of first light emitting devices 120 arranged in an array along a first direction X and a second direction Y that cross with each other, and the second display region 200 is provided with a plurality of first pixel driving circuits 130 and a plurality of second pixel driving circuits 230 arranged in an array along the first direction X and the second direction Y. The second display region 200 is further provided with a plurality of second light emitting devices 220. The first pixel driving circuit 130 is configured to drive the first light emitting device 120, and the second pixel driving circuit 230 is configured to drive the second light emitting device 220. The second pixel driving circuit 230 and the corresponding second light emitting device 220 form the light emitting unit 210. It should be noted that in FIG. 3A, a single second light emitting device 220 is schematically marked, and an orthographic projection of the second pixel driving circuit 230 and an orthographic projection of the corresponding second light emitting device 220 on the display substrate are at least partially overlapped (for example, overlapped with each other in a direction perpendicular to the display substrate), but embodiments of the present disclosure are not limited thereto. For details, please refer to the foregoing description and the repetition will not be repeated here.

For example, as illustrated in FIG. 3A, the second display region 200 is disposed at an upper side, a lower side, a left side and a right side of the first display region 100. For example, a portion of the second display region 200 disposed at the left side of the first display region 100 and a portion of the second display region 200 disposed at the right side of the first display region 100 are symmetrical relative to each other.

Figure 3C:
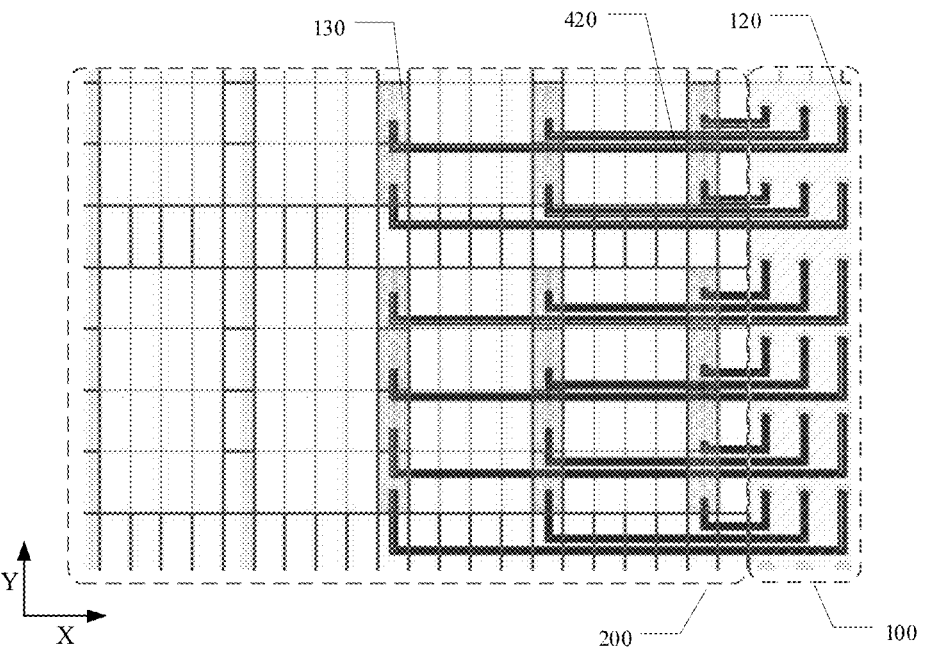
FIG. 3C and FIG. 3D are schematic diagrams of connecting wires of a first pixel driving circuit and a first light-emitting device of the display substrate shown in FIG. 3A.
Figure 3D:
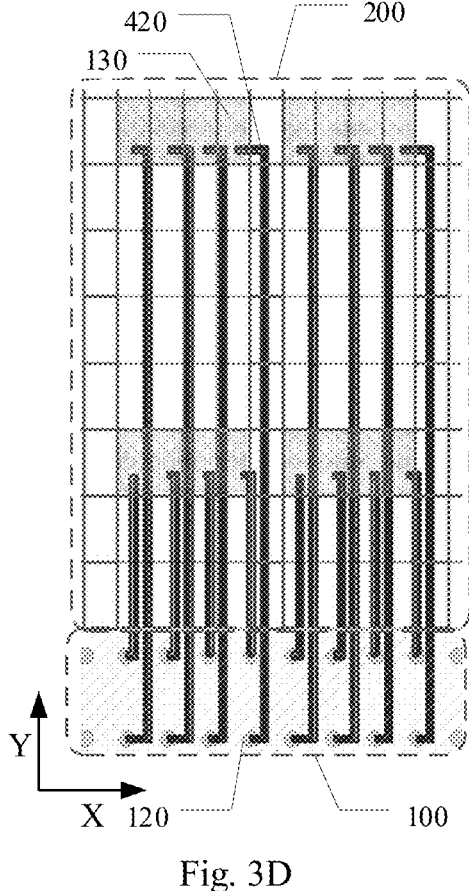

FIG. 3C and FIG. 3D are schematic diagrams showing connection lines between the first pixel driving circuit and the first light emitting device of the display substrate in FIG. 3A. As illustrated in FIG. 3C, the first light emitting devices 120 located in the first display region 100 and arranged along the first direction X may be connected to the first pixel driving circuit 130 located in the second display region 200 through the driving connection line 420 extending along the first direction X. As illustrated in FIG. 3D, the first light emitting devices 120 located in the first display region 100 and arranged along the second direction Y can be connected to the first pixel driving circuit 130 located in the second display region 200 through the driving connection line 420 extending in the second direction Y. Of course, embodiments of the present disclosure include but are not limited thereto, and the first light emitting device 120 located in the first display region 100 may be connected to the first pixel driving circuit 130 located in the second display region 200 through the driving connection line 420 extending in a direction with a certain inclination angle relative to the first direction X or the second direction Y (i.e., obliquely). For example, the driving connection line 420 may also be a bent line composed of driving connection lines 420 extending in at least two different directions.

For example, a material of the driving connection line 420 is transparent conductive oxide, such as indium tin oxide (ITO). Therefore, in a case that the driving connection line 420 is connected to the first display region 100, the light transmittance of the first display region 100 will not be affected.

For example, the first initialization transistor T7 of the first pixel driving circuit 130 is electrically connected to the electrode of the corresponding first light emitting device 120 so as to be configured to apply an initialization signal to the electrode of the first light emitting device 120.

For example, the second initialization transistor T7' of the second pixel driving circuit 230 is electrically connected to the electrode of the corresponding second light emitting device 220 so as to be configured to apply an initialization signal to the electrode of the x20.

For example, as illustrated in FIGS. 3A and 3B, the plurality of first pixel driving circuits 130 and the plurality of second pixel driving circuits 230 are arranged in a staggered manner, wherein the plurality of first pixel driving circuits 130 can be disposed at some array grid positions arranged along the first direction X and the second direction Y, while the plurality of second pixel driving circuits 230 are disposed at some other array grid positions arranged along the first direction X and the second direction Y. It should be noted that the plurality of second pixel driving circuits 230 and the plurality of first pixel driving circuits 130 may not fill all the positions of the two-dimensional array grids arranged along the first direction X and the second direction Y, and some positions may be left empty or provided with other elements or structures. The array grid position in the diagram is also the square grid position of the array arrangement in the second display region, and each grid position defines a region of the first pixel driving circuit or the second pixel driving circuit arranged at the grid position.

For example, as illustrated in FIGS. 3A and 3B, part of the first pixel driving circuits 130 and part of the second pixel driving circuits 230 can be arranged along the first direction X, which can be referred to as the first pixel driving circuit 130 and the second pixel driving circuit 230 located in a same row. Part of the first pixel driving circuits 130 and part of the second pixel driving circuits 230 can be arranged along the second direction Y, which can be referred to as the first pixel driving circuit 130 and the second pixel driving circuit 230 located in a same column. For example, in a plan view, a straight line along the first direction X may pass through all the first pixel driving circuits 130 and all the second pixel driving circuits 230 located in a same row, and a straight line along the second direction Y may pass through all the first pixel driving circuits 130 and all the second pixel driving circuits 230 located in a same column.

As illustrated in FIGS. 3A and 3B, the second display region 200 further includes a plurality of initialization signal lines 300, which are respectively connected to the plurality of first pixel driving circuits 130 and the plurality of second pixel driving circuits 230 and are configured to apply different initialization signals to the first light emitting device 120 and the second light emitting device 220.

In the display substrate provide by the embodiments of the present disclosure, the first pixel driving circuit 130 of the first display region 100 and the second pixel drive circuit 230 of the second display region 200 are respectively connected to different initialization signal lines 300, so that different initialization signals can be respectively applied to the first light emitting device 120 and the second light emitting device 220, and the display difference caused by the external arrangement of the first pixel driving circuit of the first light emitting device 120 and caused by the light emitting area different from that of the second display region 200 can be reduced when the anodes of the first light emitting device 120 and the second light emitting device 220 are initialized, thereby improving the display effects of the first display region 100 and the second display region 200. For example, different initialization signal lines 300 respectively connected to the first pixel driving circuit 130 of the first display region 100 and the second pixel driving circuit

230 of the second display region 200 can be driven independently, so that different initialization signals can be applied to the first pixel driving circuit 130 and the second pixel driving circuit 230, respectively. For example, initialization signals of different initialization signal lines may have different potentials.

In some examples, as illustrated in FIGS. 3A and 3B, the first pixel driving circuit 130 and the second pixel driving circuit 230 located in a same row of the display substrate 10 are connected to different initialization signal lines. For example, in the left and right regions of the first display region 100 illustrated in FIGS. 3A and 3B, at least part of the first pixel driving circuits 130 and at least part of the second pixel driving circuits 230 are located in a same row, but the first pixel driving circuit 130 and the second pixel driving circuit 230 located in the same row are connected to different initialization signal lines 310 and 320. The specific routing mode of these two types of initialization signal lines will be described in more detail in the following embodiments.

In some examples, as illustrated in FIGS. 3A and 3B, the first pixel driving circuit 130 and the second pixel driving circuit 230 located in a same column of the display substrate 10 are connected to different initialization signal lines. For example, in an upper region of the first display region 100 illustrated in FIGS. 3A and 3B, at least part of the first pixel driving circuits 130 and at least part of the second pixel driving circuits 230 are located in a same column, but the first pixel driving circuit 130 and the second pixel driving circuit 230 located in the same column are respectively connected to different initialization signal lines 310 and 320. It should be noted that this diagram only shows a schematic plan view of the first pixel driving circuits 130 located at the left and right sides as well as the upper side of the first display region 100, but embodiments of the present disclosure are not limited thereto. The first pixel driving circuit 130 can also be located at a lower side of the first display region 100, with arrangement and routing mode as same as those at the upper side, so the details are not repeated here.

In some examples, as illustrated in FIGS. 3A and 3B, the second display region 200 of the display substrate 10 includes a plurality of dummy rows 400R and a plurality of dummy columns 400C, with a plurality of normal rows 410R provided between every two adjacent dummy rows 400R and a plurality of normal columns 410C provided between every two adjacent dummy columns 400C. For example, the dummy rows, dummy columns, normal rows and normal columns here are only used to distinguish the arrangement of the grid positions of the two-dimensional array arranged along the first direction and the second direction. For example, some grid positions are located on dummy columns and dummy rows, some grid positions are located on dummy columns and normal rows, some grid positions are located on normal columns and dummy rows, and some grid positions are located on normal columns and normal rows.

In some examples, as illustrated in FIGS. 3A and 3B, part of the plurality of first pixel driving circuits 130 are located in the dummy row 400R, or part of the first pixel driving circuits 130 are located in the dummy column 400C. The second pixel driving circuits 230 among the plurality of light emitting units 210 are located in both the normal row 410R and the normal column 410C.

In some examples, as illustrated in FIGS. 3A and 3B, part of the plurality of first pixel driving circuits 130 are located in the dummy row 400R and also in the normal column 410C, or part of the first pixel driving circuits 130 are located in the dummy column 400C and also in the normal row 410R. For example, in the left and right regions of the first display region 100, a plurality of first pixel driving circuits 130 are located in the dummy column 400C and also in the normal row 410R. For example, in the upper region of the first display region 100, a plurality of first pixel driving circuits 130 are located in the dummy row 400R and also in the normal column 410C. For example, the second pixel driving circuits 230 of the plurality of light emitting units 210 are located in both the normal row 410R and the normal column 410C. For the grid position where the first pixel driving circuit 130 and the second pixel driving circuit 230 are not provided (that is to say, the grid position on the dummy row 400R or the dummy column 400C where the first pixel driving circuit 130 is not provided), dummy pixel driving circuits may be provided, and these dummy pixel driving circuits may not be used to drive any of the light emitting devices. However, embodiments according to the present disclosure are not limited thereto, and other structures or elements may be provided at the grid positions located on both dummy rows and dummy columns.

For example, as illustrated in FIGS. 3A and 3B, a plurality of normal rows 410R, such as four normal rows 410R, are arranged between every two adjacent dummy rows 400R. By compressing the pixel driving circuits of the original four normal rows 410R along the second direction Y, an arrangement space for pixel driving circuits of one dummy row 400R can be added, and the pixel driving circuits of four normal rows 410R before compression occupy a same space as that occupied by the pixel driving circuits of the four normal rows 410R after compression plus the pixel driving circuits of one newly added dummy row 400R. Similarly, a plurality of normal columns 410C, such as four normal columns 410C, are arranged between every two adjacent dummy columns 400C. By compressing the pixel driving circuits of the original four normal columns 410C along the first direction X, an arrangement space for pixel driving circuits of one dummy column 400C is added, and the pixel driving circuits of four normal columns 410C before compression occupy a same space as that occupied by the pixel driving circuits of the four normal columns 410C after compression plus the pixel driving circuits of one newly added dummy column 400C. Therefore, the pixel driving circuits of the newly added dummy row 400R and the pixel driving circuits of the newly added dummy column 400C will not affect the display effect of the second display region. Of course, embodiments of the present disclosure include but are not limited thereto.

In some examples, as illustrated in FIGS. 3A and 3B, the plurality of initialization signal lines 300 include the first initialization signal line 310 connected to the first pixel driving circuit 130 and configured to apply an initialization signal to the first light emitting device 120. The plurality of initialization signal lines 300 further include the second initialization signal line 320 extending in the first direction X, the second initialization signal line 320 is connected to the second pixel driving circuit 230 located in the same row and configured to apply an initialization signal to the second light emitting device 220. Therefore, the first pixel driving circuit 130 of the first display region 100 and the second pixel driving circuit 230 of the second display region 200 are respectively connected to different initialization signal lines; and because different initialization signals can be applied to the first light emitting device 120 and the second light emitting device 220, the display difference between the first display region 100 and the second display region 200 can be reduced, and the display effect can be further improved.

In some examples, as illustrated in FIGS. 3A and 3B, an orthographic projection of a portion of the first initialization signal line 310 extending in the first direction X on the display substrate is located in an orthographic projection of a plurality of dummy rows 400R on the display substrate.

FIG. 3A only schematically shows that the orthographic projection of the portion of the first initialization signal line 310 extending in the first direction X on the display substrate is only located in a partial region of the orthographic projection of the plurality of dummy rows 400R on the display substrate in the X direction, that is to say, it does not occupy the entire dummy row in the X direction. However, embodiments according to the present disclosure are not limited thereto, and the orthographic projection of the portion of the first initialization signal line 310 extending in the first direction X on the display substrate may also be located in the entire region of the orthographic projection of the plurality of dummy rows 400R on the display substrate in the X direction, that is to say, it may occupy the entire dummy row in the X direction. For clearer explanation, this situation is schematically illustrated in FIG. 3B. As illustrated in FIG. 3B, the portion of the first initialization signal line 310 extending in the X direction extends throughout the entire dummy row 400R.

In some examples, as illustrated in FIGS. 3A and 3B, an orthographic projection of a portion of the first initialization signal line 310 extending in the second direction Y on the display substrate is located in an orthographic projection of a plurality of dummy columns 400C on the display substrate.

As illustrated in FIG. 3A, the peripheral region BB of the display substrate 10 further includes a first initialization bus 310A and a second initialization bus 320A. The first initialization bus 310A connects the plurality of first initialization signal lines 310 in the display region AA, and applies the first initialization signal Vinit1 to the plurality of first initialization signal lines 310. The second initialization bus 320A connects a plurality of second initialization signal lines 320 in the display region AA, and applies the second initialization signal Vinit2 for the plurality of second initialization signal lines 320. The first initialization bus 310A and the second initialization bus 320A are connected to an integrated circuit 590.

Figure 4A:
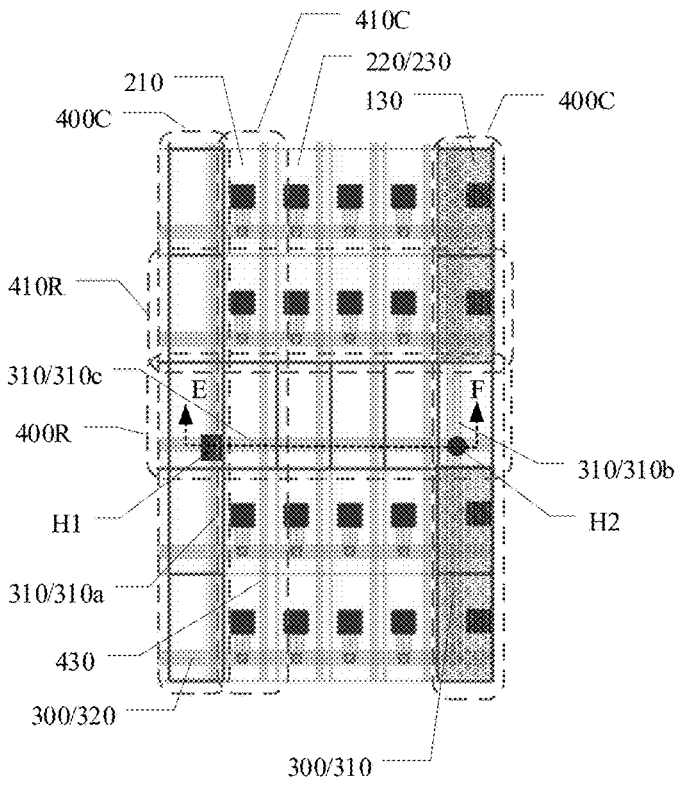
FIG. 4A is a partially enlarged schematic view of region A in FIG. 3B.
Figure 4B:
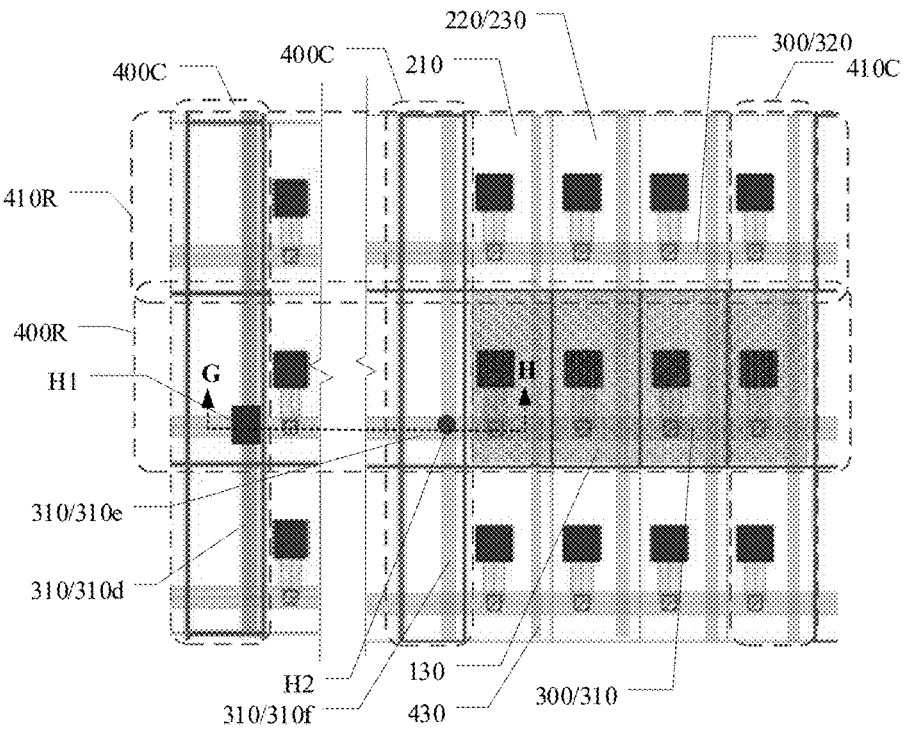
FIG. 4B is a partially enlarged schematic view of region B in FIG. 3B.

FIG. 4A is a partially enlarged schematic view of region A in FIG. 3B; FIG. 4B is a partially enlarged schematic view of region B in FIG. 3B.

In some examples, as illustrated in FIGS. 3B and 4A, the second display region 200 includes a first display sub-region 240 located at at least one side of the first display region 100 in the first direction X, and at least part of the plurality of first pixel driving circuits 130 are disposed in the first display sub-region 240. The first initialization signal line 310 includes a first sub-portion 310a located at a side of the first display sub-region 240 away from the first display region 100, a second sub-portion 310b located in the first display sub-region 240, and a connection portion 310c connecting the first sub-portion 310a and the second sub-portion 310b. For example, the second sub-portion 310b of the first initialization signal line 310 located in the first display sub-region 240 is connected to the first pixel driving circuit 130 located in the first display sub-region 240.

In some examples, as illustrated in FIGS. 3B and 4A, the first sub-portion 310a and the second sub-portion 310b extend in the second direction Y, and the connection portion 310c extends in the first direction X.

In some examples, as illustrated in FIGS. 1 and 4A, the first sub-portion 310a is located in the dummy column 400C of the first display sub-region 240 away from the first display region 100, the second sub-portion 310*b* is located in the dummy column 400C of the first display sub-region 240, and the connection portion 310*c* is located in the dummy row 400R. The first pixel driving circuit 130 is disposed in the dummy column 400C of the first display sub-region 240, and the first initialization signal line 310 can be connected to the first pixel driving circuit 130 through the second sub-portion 310*b*.

In some examples, as illustrated in FIGS. 3B and 4A, the connection portion 310*c* is located in a same layer as the second initialization signal line 320; and the first sub-portion 310*a* and the second sub-portion 310*b* are located in different layers from the second initialization signal line 320. For example, the connection portion 310*c* extends along the first direction X and is located in the dummy row 400R, and the second initialization signal line 320 also extends along the first direction X and is located in the normal row 410R, so that the connection portion 310*c* can be arranged in the same layer as the second initialization signal line 320; the first sub-portion 310*a* and the second sub-portion 310*b* extend along the second direction Y which is different from the extending direction of the second initialization signal line 320, and the first sub-portion 310*a* and the second sub-portion 310*b* are arranged in different layers from the second initialization signal line 320.

In some examples, as illustrated in FIGS. 3B and 4A, the second sub-portion 310*b* is connected to the first pixel driving circuit 130 located in the same column of the first display sub-region 240.

For example, the first pixel driving circuit may be further provided at a side of the second display region 200 away from the first display sub-region 240 along the first direction X, with arrangement and routing mode as same as those of the first display sub-region 240, which will not be described in detail here. For example, the side of the second display region 200 away from the first display sub-region 240 along the first direction X may be symmetrical about the first display region 100, and the first display sub-region 240 may be symmetrical about the first display region 100.

In some examples, as illustrated in FIGS. 3B and 4B, the second display region 200 includes a second display sub-region 250 located at at least one side of the first display region 100 in the second direction Y, and at least part of the plurality of first pixel driving circuits 130 are disposed in the second display sub-region 250. The first initialization signal line 310 includes a third sub-portion 310*d* located outside the second display sub-region 250, and a fourth sub-portion 310*e* extending from the outside of the second display sub-region 250 into the second display sub-region 250. The third sub-portion 310*d* extends in the second direction Y, and the fourth sub-portion 310*e* extends in the first direction X. The fourth sub-portion 310*e* extending into the second display sub-region 250 is connected to the first pixel driving circuit 130 provided in the second display sub-region 250.

In some examples, as illustrated in FIGS. 3B and 4B, the third sub-portion 310*d* is located in the dummy column 400C, and the fourth sub-portion 310*e* is located in the dummy row 400R. The first pixel driving circuit 130 is disposed in the dummy column 400C of the second display sub-region 250, and the first initialization signal line 310 can be connected to the first pixel driving circuit 130 through the fourth sub-region 310*e*.

In some examples, as illustrated in FIGS. 3B and 4B, the fourth sub-portion 310*e* and the second initialization signal line 320 are located in the same layer; and the third sub-portion 310*d* and the second initialization signal line 320 are located in different layers. For example, the fourth sub-portion 310*e* extends along the first direction X, and the second initialization signal line 320 also extends along the first direction X, so that the fourth sub-portion 310*e* can be arranged in the same layer as the second initialization signal line 320; the third sub-portion 310*d* extends in the second direction Y which is different from the extending direction of the second initialization signal line 320, and the third sub-portion 310*d* is arranged in different layer from the second initialization signal line 320.

For example, the first pixel driving circuit may be further provided at a side of the second display region 200 away from the second display sub-region 250 along the second direction Y, with arrangement and routing mode as same as those of the second display sub-region 240, which will not be described in detail here. For example, the side of the second display region 200 away from the second display sub-region 250 in the second direction Y may be symmetrical about the first display region 100, and the second display sub-region 250 may also be symmetrical about the first display region 100.

In some examples, as illustrated in FIGS. 3B and 4A, the display substrate 10 further includes data signal lines 430 arranged in the normal column 410C and extending in the second direction Y. The data signal line is configured to provide a data signal to the second pixel driving circuit 230, and the first sub-portion 310*a* of the first initialization signal line 310 is arranged in the same layer as the data signal line 430. Thus, the first sub-portion 310*a* of the first initialization signal line 310 can be formed at the same time when the data signal line 430 is formed. For example, the first sub-portion 310*a* of the first initialization signal line 310 may have the same pattern as the data signal line 430 for different signal traces. In addition, the data signal line for providing the data signal to the second pixel driving circuit 230 is further provided in the normal column 410C passing through the first display sub-region; the data signal line for providing the data signal to the first pixel driving circuit 130 is further provided in the dummy column 400C passing through the first display sub-region, which will not be described in detail here.

In some examples, as illustrated in FIGS. 3B and 4A, the first sub-portion 310*a* and the connection portion 310*c* of the first initialization signal line 310 are connected through a via hole H1, and the connection portion 310*c* and the second sub-portion 310*b* are located in different layers and connected through a via hole H2.

In some examples, as illustrated in FIGS. 3B and 4B, the display substrate 10 further includes data signal lines 430 arranged in the normal column 410C and extending in the second direction Y. The data signal line is configured to provide a data signal to the second pixel driving circuit 230, and the third sub-portion 310*d* of the first initialization signal line 310 is arranged in the same layer as the data signal lines 430. Thus, the third sub-portion 310*d* of the first initialization signal line 310 can be formed at the same time when the data signal line 430 is formed. For example, the third sub-portion 310*d* of the first initialization signal line 310 may have the same pattern as the data signal line 430 for different signal traces. In addition, the data signal line for providing the data signal to the first pixel driving circuit 130 and the second pixel driving circuit 230 is further provided in the normal column 410C passing through the second display sub-region, which will not be described in detail here.

In some examples, as illustrated in FIGS. 3B and 4B, the third sub-portion 310d and the fourth sub-portion 310e of the first initialization signal line 310 are connected through the via hole H1.

For example, as illustrated in FIGS. 3B and 4B, the fourth sub-portion 310e may be further connected to a fifth sub-portion 310f through the via hole H2. Of course, the fifth sub-portion 310f may not be provided.

The first display sub-region 240 and the second display sub-region 250 are part of the second display region 200. In the first display sub-region 240 and the second display sub-region 250, in addition to the second pixel driving circuit for driving the light emitting device in the corresponding region, the first pixel driving circuit for driving the light emitting device in the first display region 100 is further provided. On the other hand, in a part of the second display region 200 other than the first display sub-region 240 and the second display sub-region 250, only the second pixel driving circuit for driving the light emitting device in the corresponding region may be provided.

Figure 5:
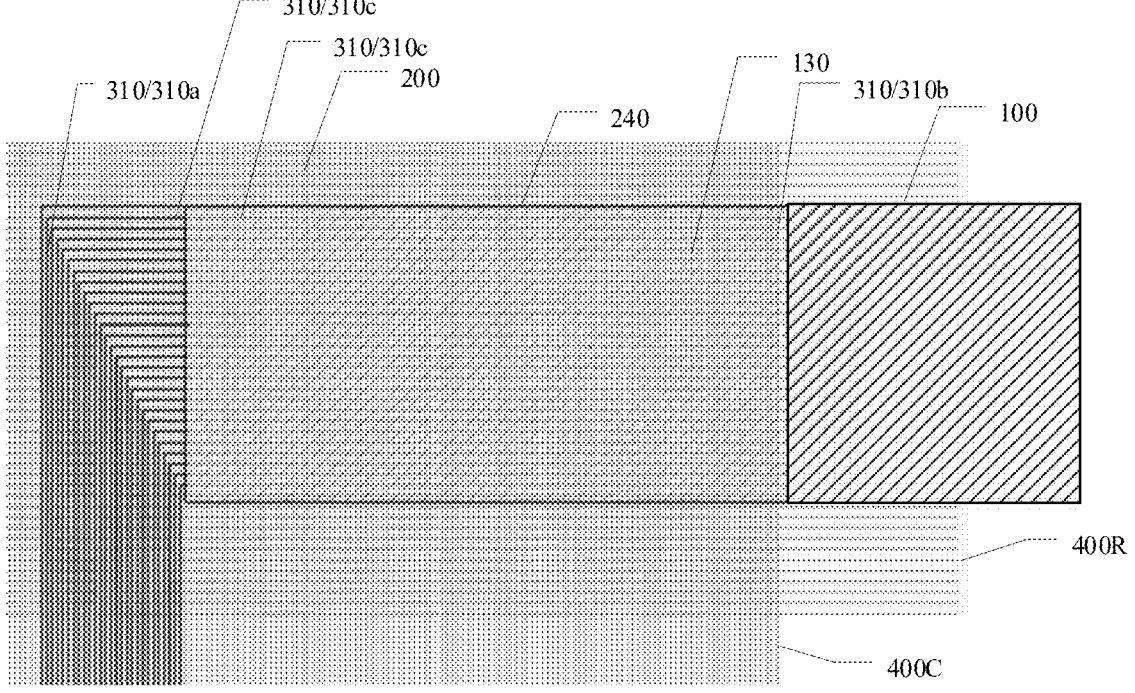
FIG. 5 is a partial wiring diagram of another display substrate provided by some embodiments of the present disclosure.

FIG. 5 is a partial wiring diagram of another display substrate provided by some embodiments of the present disclosure. As illustrated in FIG. 5, the display substrate 10 includes a first display region 100 and a second display region 200 located at at least one side of the first display region 100. The second display region 200 of the display substrate 10 includes a plurality of dummy rows 400R and a plurality of dummy columns 400C, and a plurality of normal rows 410R (not shown in the figure, located between two dummy rows 400R) are arranged between every two adjacent dummy rows 400R, a plurality of normal columns 410C (not shown in the figure, located between two dummy columns 400C) are arranged between every two adjacent dummy columns 400C. The second display region 200 includes a first display sub-region 240 located at at least one side of the first display region 100 in the first direction X, and at least part of the plurality of first pixel driving circuits 130 are disposed in the first display sub-region 240. At least part of the plurality of first pixel driving circuits 130 are located in a plurality of dummy columns 400C and also located in normal rows 410R of the first display sub-region 240, and the second pixel driving circuits 230 in the plurality of light emitting units 210 are located in both normal rows 410R and normal columns 410C.

The first initialization signal line 310 is connected to the first pixel driving circuit 130, the first initialization signal line 310 includes a first sub-portion 310a located at a side of the first display sub-region 240 away from the first display region 100, a second sub-portion 310b located in the first display sub-region 240, and a connection portion 310c connecting the first sub-portion 310a and the second sub-portion 310b. The second sub-portion 310b of the first initialization signal line 310 is connected to the first pixel driving circuit 130 located in the first display sub-region 240.

For example, as illustrated in FIG. 5, the first sub-portion 310a and the second sub-portion 310b extend in the second direction Y, and the connection portion 310c extends in the first direction X.

For example, as illustrated in FIG. 5, the first sub-portion 310a is located in the dummy column 400C of the first display sub-region 240 away from the first display region 100, the second sub-portion 310b is located in the dummy column 400C of the first display sub-region 240, and the connection portion 310c is located in the dummy row 400R. The first pixel driving circuit 130 is disposed in the dummy column 400C of the first display sub-region 240, and the first initialization signal line 310 can be connected to the first pixel driving circuit 130 through the second sub-portion 310b.

For example, as illustrated in FIG. 5, the second sub-portion 310b is connected to the first pixel driving circuit 130 located in the same column in the first display sub-region 240.

Figure 6A:
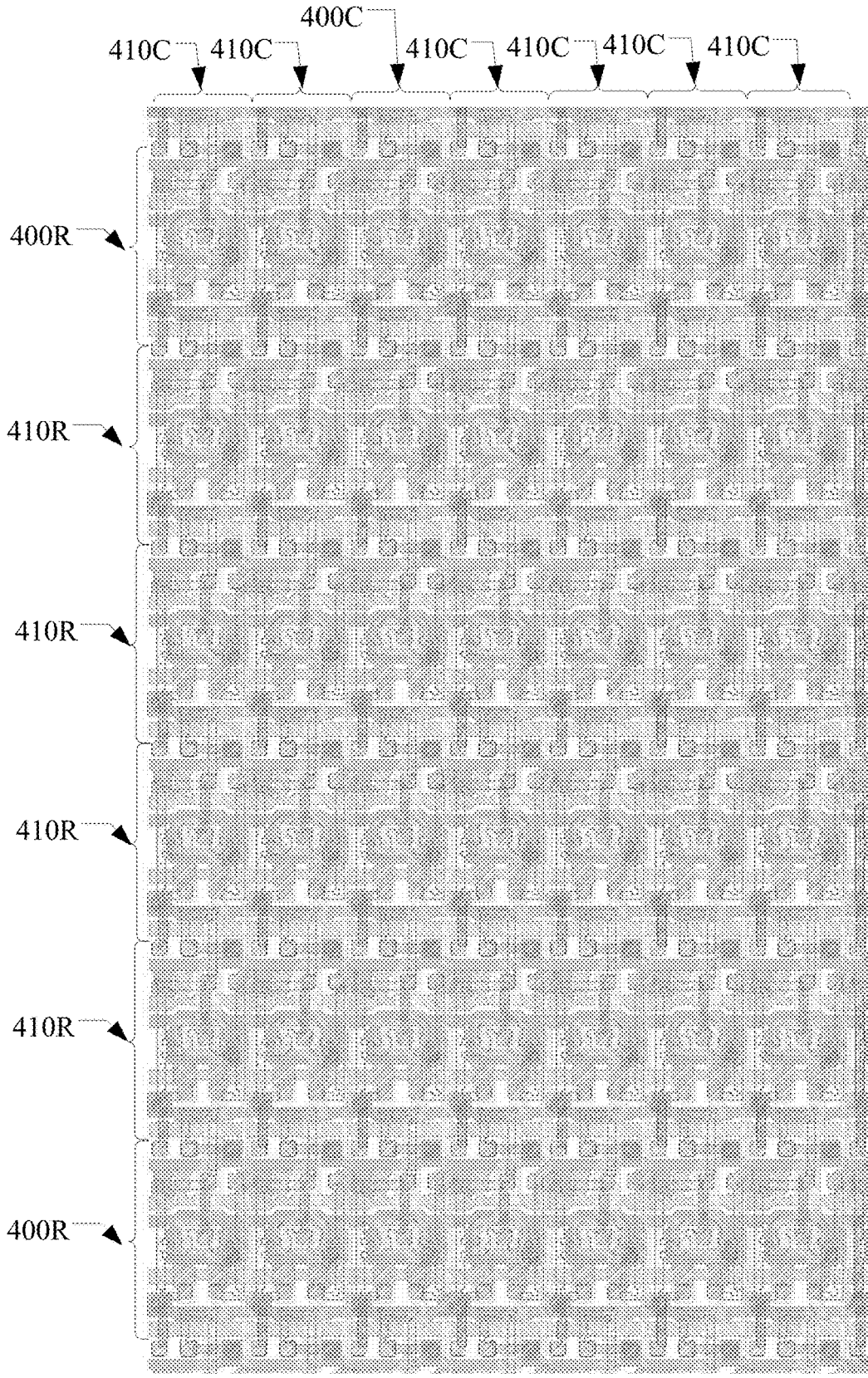
FIGS. 6A and 6B are schematic views of a partial plane structure of a second display region of another display substrate provided by some embodiments of the present disclosure.
Figure 6B:
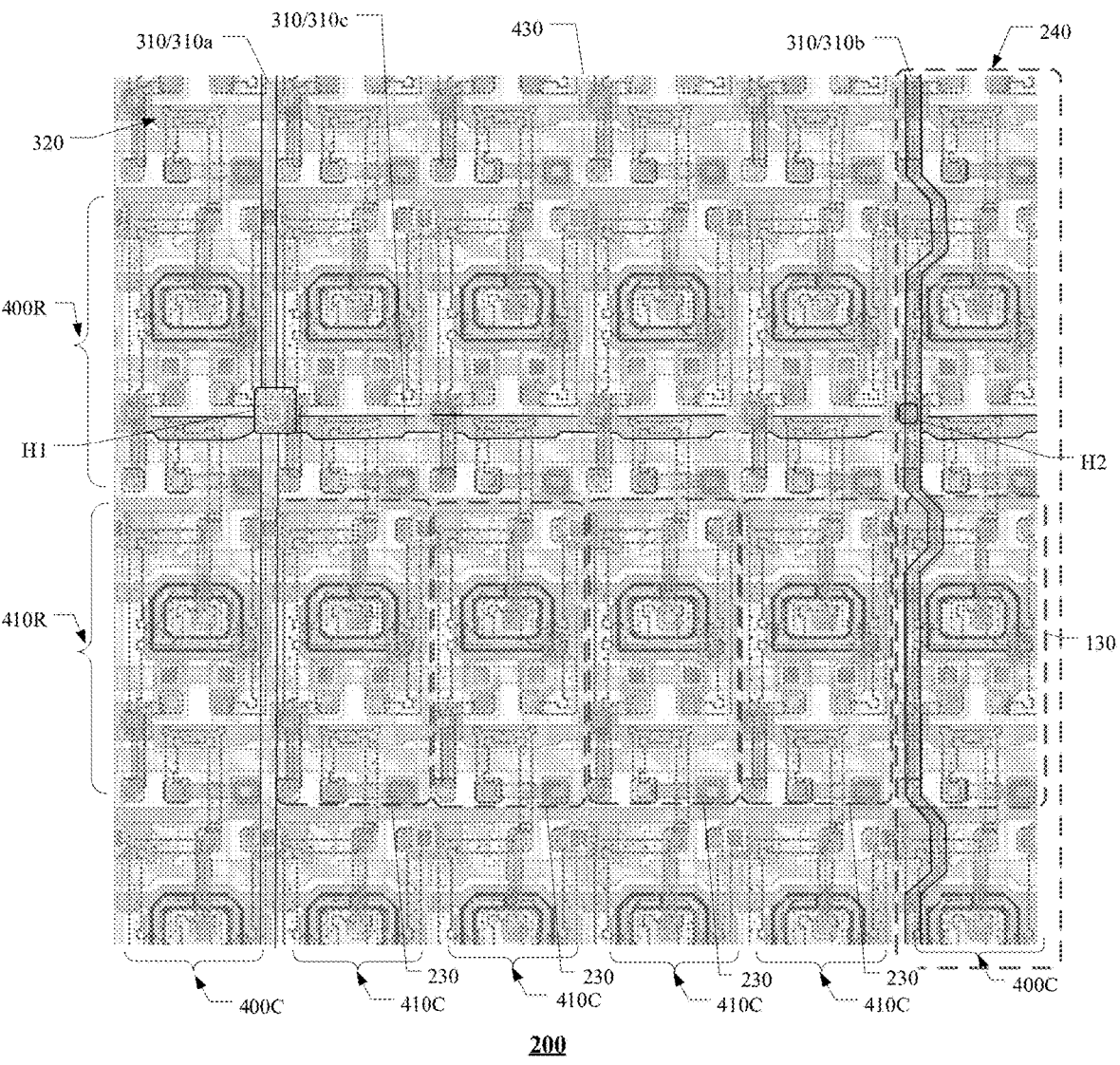

FIGS. 6A and 6B are schematic views of a partial plane structure of a second display region of another display substrate provided by some embodiments of the present disclosure.

As illustrated in FIG. 6A, the second display region 200 of the display substrate 10 includes a plurality of dummy rows 400R and a plurality of dummy columns 400C, with a plurality of normal rows 410R provided between every two adjacent dummy rows 400R and a plurality of normal columns 410C provided between every two adjacent dummy columns 400C.

For example, as illustrated in FIG. 6A, four normal rows 410R are arranged between every two adjacent dummy rows 400R of the display substrate 10, and four normal columns 410C are arranged between every two adjacent dummy columns 400C.

For example, as illustrated in FIG. 6B, the second display region 200 includes the first display sub-region 240 located at at least one side of the first display region 100 in the first direction X, and at least part of the plurality of first pixel driving circuits 130 are disposed in the first display sub-region 240. For example, the second sub-portion 310b of the first initialization signal line can be seen in the first display sub-region 240 of FIG. 6B.

For example, as illustrated in FIG. 6B, the first pixel driving circuit 130 disposed in the first display sub-region 240 is located in the dummy column 400C and also in the normal row 410R. The second pixel driving circuits 230 of the plurality of light emitting units 210 are located in both the normal row 410R and the normal column 410C.

As illustrated in FIG. 6B, the plurality of initialization signal lines 300 of the display substrate 10 include the first initialization signal line 310, which is connected to the first pixel driving circuit 130 and configured to apply an initialization signal to the first light emitting device 120. The plurality of initialization signal lines 300 further include the second initialization signal line 320 extending in the first direction X, the second initialization signal line 320 is connected to the second pixel driving circuit 230 located in the same row and configured to apply an initialization signal to the second light emitting device 220. Therefore, the first pixel driving circuit 130 of the first display region 100 and the second pixel driving circuit 230 of the second display region 200 are respectively connected to different initialization signal lines; and because different initialization signals can be applied to the first light emitting device 120 and the second light emitting device 220, the display difference between the first display region 100 and the second display region 200 can be reduced, and the display effect can be further improved.

In some examples, as illustrated in FIG. 6B, the first initialization signal line 310 includes a first sub-portion 310a located at a side of the first display sub-region 240 away from the first display region 100, a second sub-portion 310b located in the first display sub-region 240, and a connection portion 310c connecting the first sub-portion 310a and the second sub-portion 310b. The second sub-portion 310b of the first initialization signal line 310 located in the first display sub-region 240 is connected to the first pixel driving circuit 130 located in the first display sub-region 240. In the following schematic view of layered structure, each portion of the first initialization signal line will be more clearly illustrated.

In some examples, as illustrated in FIG. 6B, the first sub-portion 310a and the second sub-portion 310b extend in the second direction Y, and the connection portion 310c extends in the first direction X.

In some examples, as illustrated in FIG. 6B, the first sub-portion 310a is located in the dummy column 400C of the first display sub-region 240 away from the first display region 100, the second sub-portion 310b is located in the dummy column 400C of the first display sub-region 240, and the connection portion 310c is located in the dummy row 400R. The first pixel driving circuit 130 is disposed in the dummy column 400C of the first display sub-region 240, and the first initialization signal line 310 can be connected to the first pixel driving circuit 130 through the second sub-portion 310b.

In some examples, as illustrated in FIG. 6B, the connection portion 310c is located in the same layer as the second initialization signal line 320; and the first sub-portion 310a and the second sub-portion 310b are located in different layers from the second initialization signal line 320. For example, the connection portion 310c extends along the first direction X and is located in the dummy row 400R; and the second initialization signal line 320 also extends along the first direction X and is located in the normal row 410R, so that the connection portion 310c can be arranged in the same layer as the second initialization signal line 320; the first sub-portion 310a and the second sub-portion 310b extend in the second direction Y, which is different from the extending direction of the second initialization signal line 320, so that the first sub-portion 310a and the second sub-portion 310b are arranged in different layers from the second initialization signal line 320.

In some examples, as illustrated in FIG. 6B, the second sub-portion 310b is connected to the first pixel driving circuit 130 located in the same column of the first display sub-region 240.

In some examples, as illustrated in FIG. 6B, the display substrate 10 further includes a data signal line 430 which arranged in a normal column 410C outside the first display sub-region 240 and extending in the second direction Y. The data signal line 430 is configured to provide a data signal to the second pixel driving circuit 230, and the first sub-portion 310a of the first initialization signal line 310 is arranged in the same layer as the data signal line 430.

In some examples, as illustrated in FIG. 6B, the first sub-portion 310a and the connection portion 310c of the first initialization signal line 310 are connected through a via hole H1, and the connection portion 310c and the second sub-portion 310b are located in different layers and connected through a via hole H2.

FIGS. 7A to 7E are schematic views of partial films of a first pixel driving circuit and a second pixel driving circuit in a second display region according to some embodiments of the present disclosure.

Figure 7A:
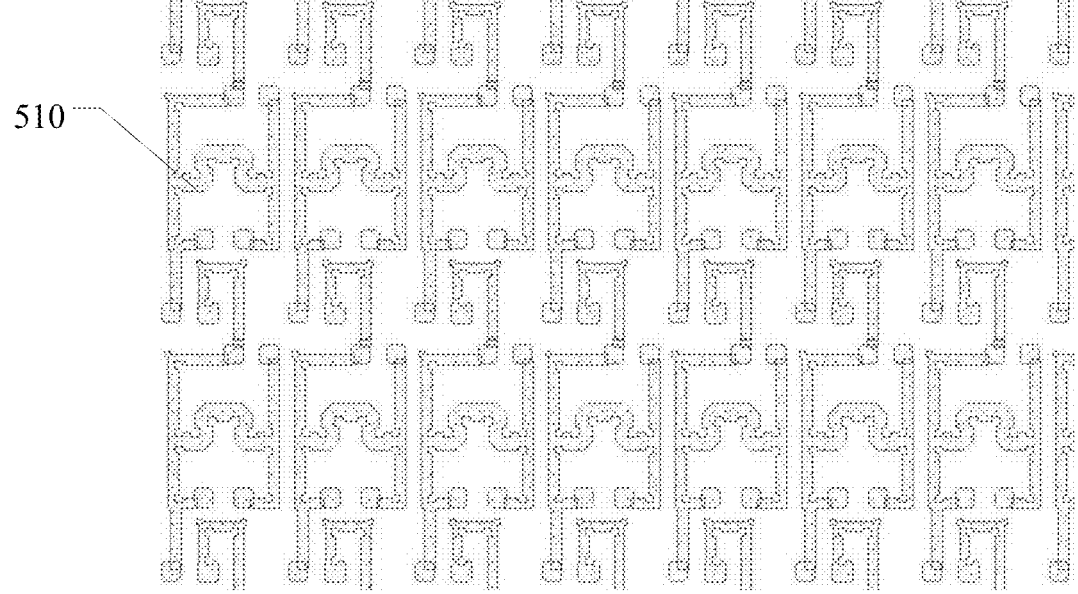
FIGS. 7A to 7E are schematic views of partial films of a first pixel driving circuit and a second pixel driving circuit in a second display region according to some embodiments of the present disclosure.

In some examples, as illustrated in FIG. 7A, the display substrate 10 includes a base substrate (not shown in the figure) and a first semiconductor layer 510 on the base substrate.

Figure 7B:
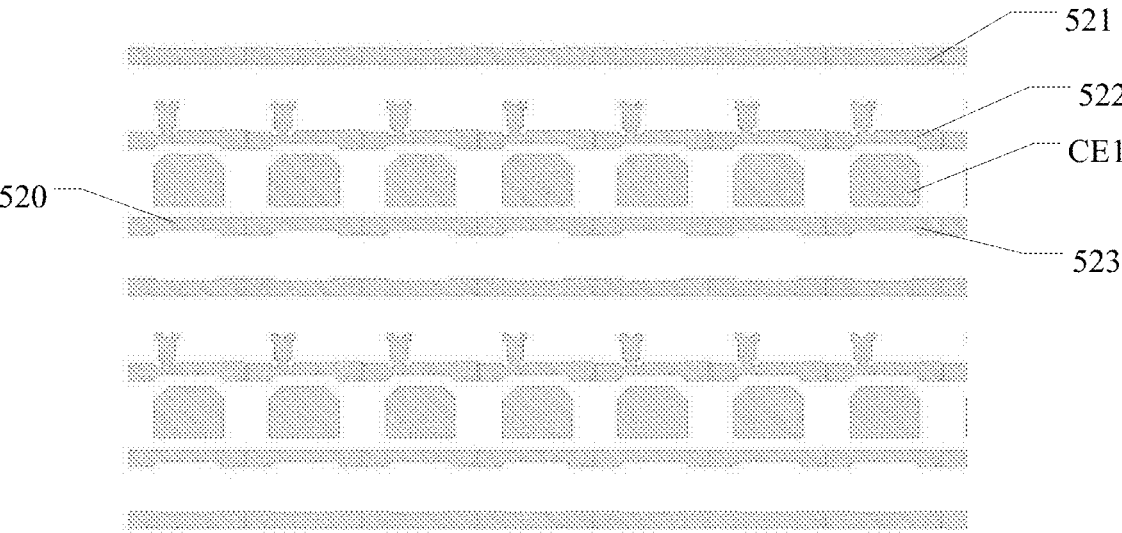

For example, as illustrated in FIG. 7B, the display substrate 10 includes a first gate layer 520, which is located at a side of the first semiconductor layer 510 away from the base substrate. A reset signal line 521, a gate line 522, a first electrode plate CE1 of the capacitor and a light emission control line 523 are located in the first gate layer 520.

Figure 7C:
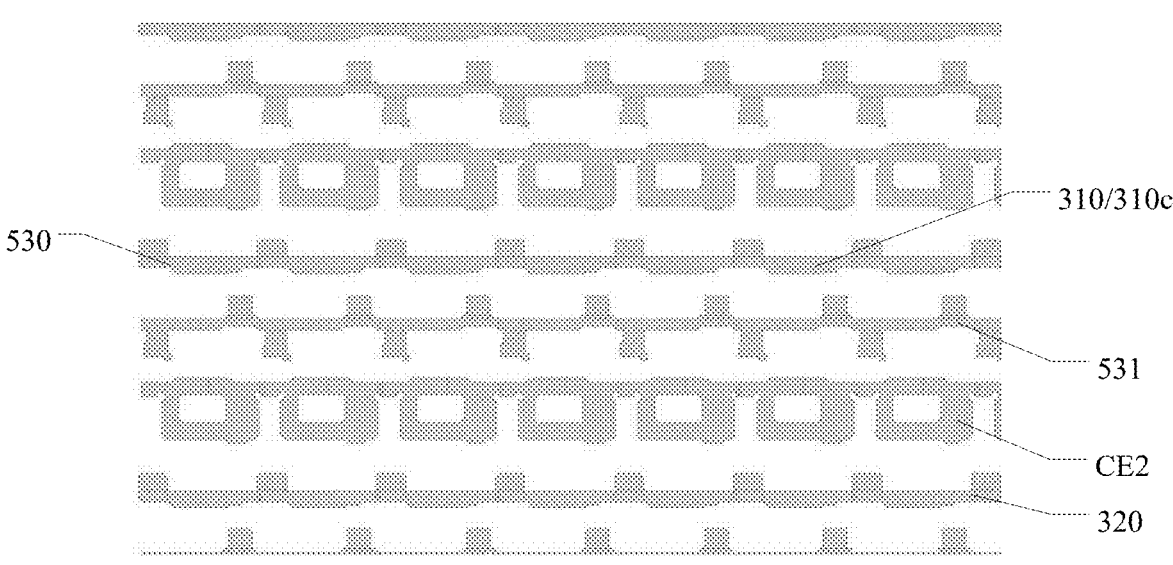

For example, as illustrated in FIG. 7C, the display substrate 10 further includes a second gate layer 530, which is located at a side of the first gate layer 520 away from the base substrate. The connection portion 310c of the first initialization signal line 310a, the second initialization signal line 320, a third initialization signal line 531 and a second electrode plate CE2 are located in the second gate layer 530. For example, the connection portion 310c of the first initialization signal line 310 and the second initialization signal line 320 are located in the same layer, the connection portion 310c of the first initialization signal line 310 is located in a dummy row, and the second initialization signal line 320 is located in a normal row.

Figure 7D:
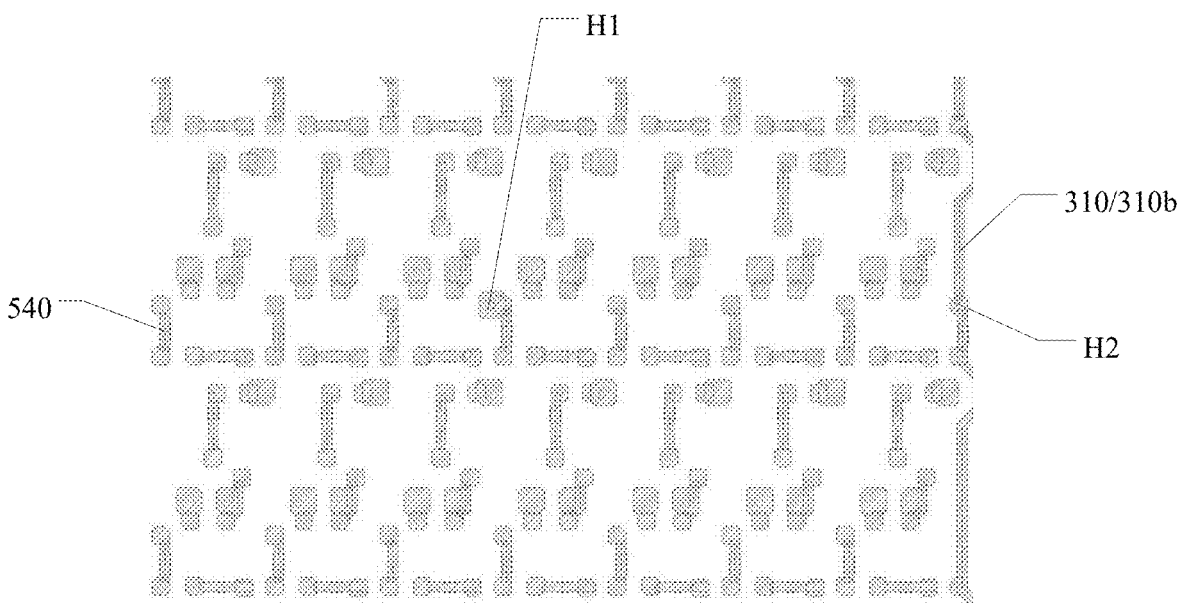

For example, as illustrated in FIG. 7D, the display substrate 10 further includes a first conductive layer 540, which is located at a side of the second gate layer 530 away from the base substrate; the second sub-portion 310b of the first initialization signal line 310 is located in the first conductive layer 540. For example, in addition to the second sub-portion 310b, the first conductive layer 540 may further include connection structures for connecting wires of different layers, which will not be described in detail here.

Figure 7E:
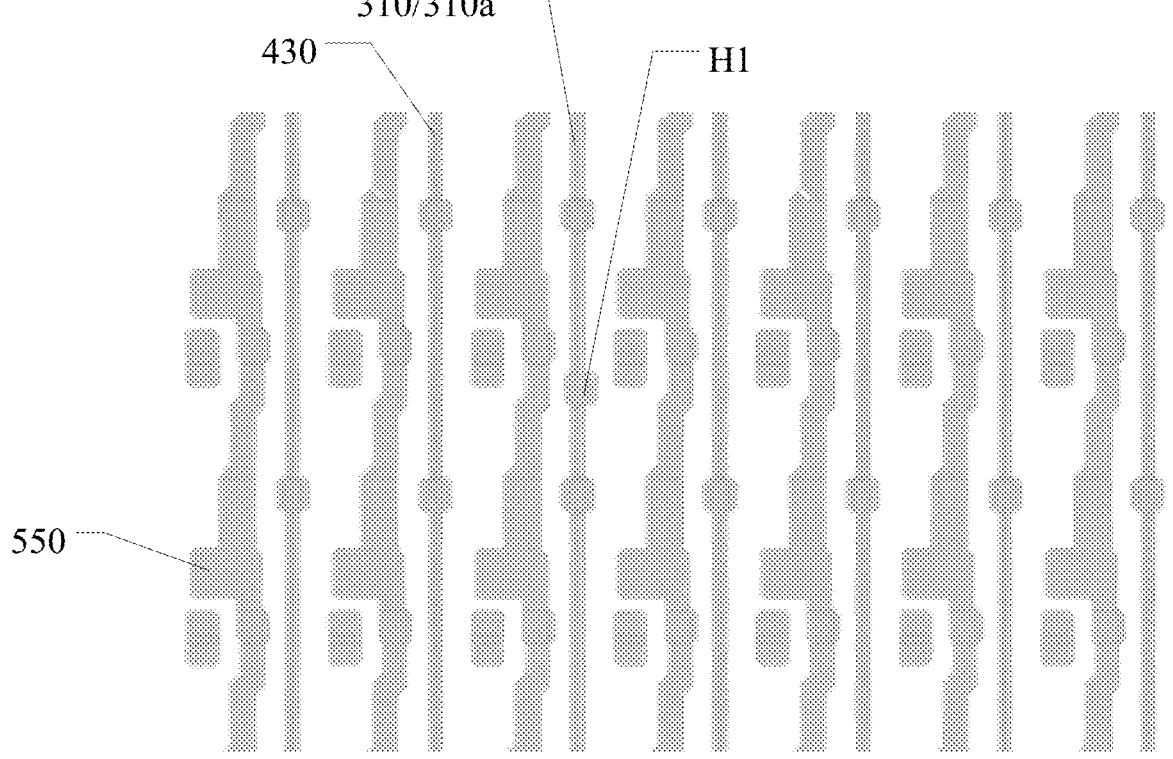

For example, as illustrated in FIG. 7E, the display substrate 10 further includes a second conductive layer 550, which is located at a side of the first conductive layer 360 away from the base substrate; the first sub-portion 310a of the first initialization signal line 310 and the data signal line 430 are located in the second conductive layer 550. For example, the first sub-portion 310a of the first initialization signal line 310 and the data signal line 430 are located in the same layer, the first sub-portion 310a of the first initialization signal line 310 is located in a dummy column, and the data signal line 430 is located in a normal column.

For example, as illustrated in FIGS. 7B to 7E, the first sub-portion 310a of the first initialization signal line 310 located in the second conductive layer 550 and the connection portion 310c located in the second gate layer 530 are connected through a via hole H1, so the second conductive layer 550 and the first conductive layer 540 further include the via hole H1. The connection portion 310c located in the second gate layer 530 and the second sub-portion 310b of the first initialization signal line 310 located in the first conductive layer 540 are connected through a via hole H2, so the first conductive layer 540 further includes the via hole H2. Of course, embodiments of the present disclosure do not limit the film layers where the first sub-portion 310a, the second sub-portion 310b and the connection portion 310c of the first initialization signal line 310 are located, and there may be other layout of film layers according to different patterned film layers and the routing mode of the pixel driving circuit. For example, the number of the film layers of the first pixel driving circuit and the second pixel driving circuit is not limited to the above description.

It should be noted that each film layer and the specific pattern in each film layer in FIGS. 7A to 7E are examples, and the film layer and the pattern in the film layer can be adjusted according to the embodiments of the present disclosure.

Figure 8A:
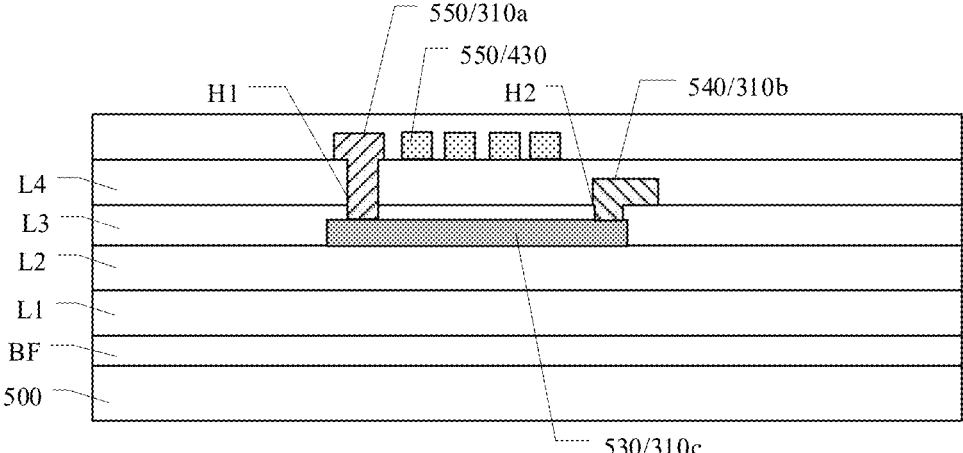
FIG. 8A is a schematic sectional view of FIG. 4A along a section line EF.

FIG. 8A is a schematic sectional view of FIG. 4A along a section line EF. This section includes the first sub-portion 310a, the second sub-portion 310b and the connection portion 310c of the first initialization signal line described in the above embodiment. As illustrated in FIG. 8A, the display substrate 10 includes a base substrate 500, a buffer layer BF disposed on the base substrate 500, a first semiconductor layer (not shown in the figure, located between the buffer layer and a first insulating layer L1) disposed on the buffer layer BF, the first insulating layer L1 disposed on the first semiconductor layer, a first gate layer (not illustrated in the figure, located between the first insulating layer L1 and a second insulating layer L2) disposed on the first insulating layer L1, the second insulating layer L2 disposed on the first gate layer, a second gate layer 530 disposed on the second insulating layer, a third insulating layer L3 disposed on the second gate layer 530, a first conductive layer 540 disposed on the third insulating layer, a fourth insulating layer L4 disposed on the first conductive layer 540, and a second conductive layer 550 disposed on the fourth insulating layer.

For example, as illustrated in FIG. 8A, the first sub-portion 310a of the first initialization signal line 310 may be located in the second conductive layer 550; the connection portion 310c of the first initialization signal line 310 may be located in the second gate layer 530; the second sub-portion 310b of the first initialization signal line 310 may be located in the first conductive layer 540; the first sub-portion 310a and the connection portion 310c may be connected to each other through the via hole H1; the connection portion 310c and the second sub-portion 310b may be connected to each other through the via hole H2; and the second sub-portion 310b is connected to the first pixel driving circuit. For example, the second conductive layer 550 may be further provided with a data signal line 430. Of course, the embodiments of the present disclosure are not intended to limit the film layers where the first sub-portion 310a, the second sub-portion 310b and the connection portion 310c of the first initialization signal line 310 are located, and there may be other layout of film layers according to different patterned film layers and the routing mode of the pixel driving circuit. For example, a side of the second conductive layer 550 away from the base substrate 500 may be further provided with a pixel definition layer, a light emitting layer, an encapsulation layer, etc., which is not limited by the embodiments of the present disclosure, and will not be illustrated and described in detail.

Figure 8B:
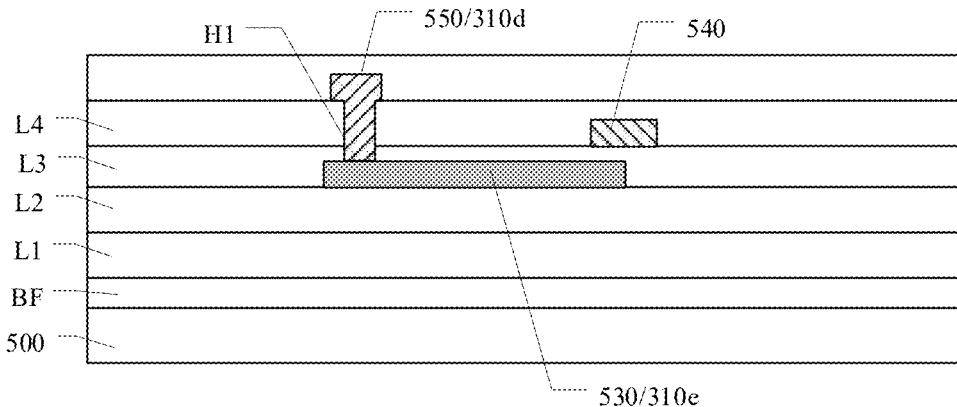
FIG. 8B is a schematic sectional view of FIG. 4B along a section line GH.

FIG. 8B is a schematic sectional view of FIG. 4B along a section line GH. This section includes the third sub-portion 310d and the fourth sub-portion 310e of the first initialization signal line described in the above embodiment. As illustrated in FIG. 7G, the third sub-portion 310d of the first initialization signal line 310 may be located in the second conductive layer 550, and the fourth sub-portion 310e of the first initialization signal line 310 may be located in the second gate layer 530. The third sub-portion 310d and the fourth sub-portion 310e of the first initialization signal line are connected to each other through the via hole H1, and the fourth sub-portion 310e is connected to the first pixel driving circuit. It should be noted that the fifth sub-portion 310f in FIG. 4B is omitted from this schematic sectional view, and this sub-portion may not be provided. Of course, the embodiment of the present disclosure is not limited to the film layers where the third sub-portion 310d and the fourth sub-portion 310e of the first initialization signal line 310 are located, and there may be other layout of film layers according to different patterned film layers and the routing mode of the pixel driving circuit. For example, a side of the second conductive layer 550 away from the base substrate 500 may be further provided with a pixel definition layer, a light emitting layer, an encapsulation layer, etc., which is not limited by the embodiments of the present disclosure, and will not be illustrated and described in detail.

It should be noted that FIGS. 8A and 8B are mainly used to illustrate examples of layered relationship and connection relationships of various portions of the first initialization signal line in the sectional structure, and are not used to limit the sectional structure of the display substrate according to the embodiments of the present disclosure. As long as the connection relationships of various portions of the first initialization signal line are satisfied, the structure of each layer in the display device according to the embodiments of the present disclosure can be increased or decreased with patterns or features, or the relative positional relationship between patterns or features may be changed.

Figure 9:
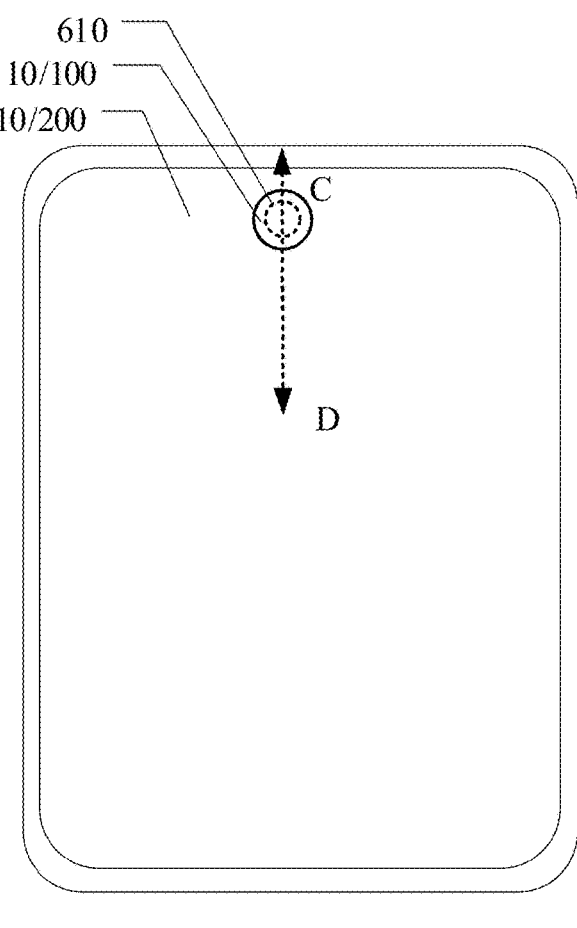
FIG. 9 is a schematic view of a display device provided by some embodiments of the present disclosure.
Figure 10:
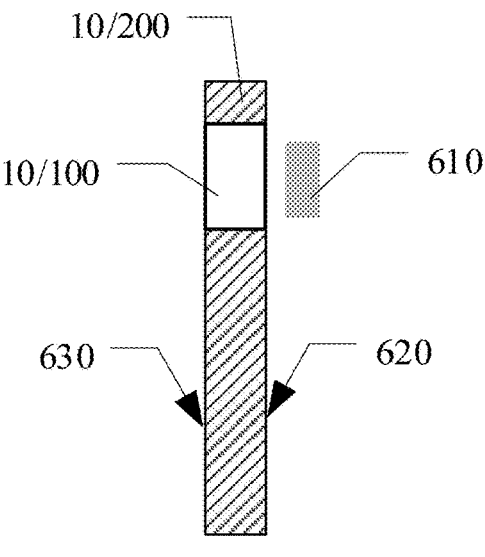
FIG. 10 is a schematic sectional view of FIG. 9 along a section line CD.

An embodiment of the present disclosure further provides a display device. FIG. 9 is a schematic view of a display device provided by some embodiments of the present disclosure; FIG. 10 is a schematic sectional view of FIG. 9 along a section line CD. As illustrated in FIG. 9, the display device 600 includes the display substrate 10 provided by any of the above examples. Therefore, the display device 600 can have the beneficial effects corresponding to the beneficial effects of the display substrate 10, which are not repeated here.

In some examples, as illustrated in FIGS. 9 and 10, the display device 600 further includes a functional device 610 located at a non-display side of the display substrate 10, and the functional device is configured to emit light to a display side of the display substrate 10 through the first display region 100; or the functional device is configured to receive light transmitted from the display side of the display substrate 10 to the non-display side 620 of the display substrate 10 through the first display region 100; or the functional device is configured to emit light to the display side 630 of the display substrate 10 through the first display region 100 and also receive light transmitted from the display side 630 to the non-display side 620 of the display substrate 10 through the first display region 100. Therefore, in the display device 600, the functional device may be arranged at the non-display side 620 of the first display region 100, so that a large screen-to-body ratio can be achieved with the functional device to be integrated.

For example, as illustrated in FIG. 9, the functional device can be a camera or an infrared sensing element. Of course, the embodiment of the present disclosure includes but is not limited thereto.

In some examples, the display device 600 can be an electronic product with display function, such as a smart phone, a tablet computer, a navigator, a display, a television and the like.

In the present disclosure, the following points need to be explained:

(1) The drawings of the embodiments of the present disclosure only refer to the structures related to the disclosed embodiments, and other structures can refer to the general designs.

(2) Without conflict, the embodiments of the present disclosure and the features in the embodiments can be combined with each other to obtain new embodiment(s).

What are described above is related to only the illustrative embodiments of the present disclosure and not limitative to the protection scope of the present disclosure. Therefore, the protection scope of the present application shall be defined by the accompanying claims.

What is claimed is:

1. A display substrate, comprising a first display region and a second display region located at at least one side of the first display region, wherein a light transmittance of the first display region is greater than that of the second display region;

the first display region is provided with a plurality of first light emitting devices arranged in an array along a first direction and a second direction crossing with each other, the second display region is provided with a plurality of first pixel driving circuits and a plurality of second pixel driving circuits arranged in an array along the first direction and the second direction, and the second display region is further provided with a plurality of second light emitting devices;

each of the plurality of first pixel driving circuits is configured to drive at least one of the plurality of first light emitting devices, and each of the plurality of second pixel driving circuits is configured to drive at least one of the plurality of second light emitting devices;

the second display region further comprises a plurality of initialization signal lines respectively connected to the plurality of first pixel driving circuits and the plurality of second pixel driving circuits and configured to apply initialization signals to the plurality of first light emitting devices and the plurality of second light emitting devices;

the first pixel driving circuit and the second pixel driving circuit are respectively connected to different initialization signal lines so that different initialization signals are respectively applied to the at least one of the plurality of first light emitting devices and the at least one of the plurality of second light emitting devices, each of the plurality of first pixel driving circuits is connected to the at least one of the plurality of first light emitting devices through a driving connection line, and the driving connection line extends from the second display region to the first display region.

2. The display substrate according to claim 1, wherein the first pixel driving circuit and the second pixel driving circuit located in a same row are connected to different initialization signal lines; and/or the first pixel driving circuit and the second pixel driving circuit located in a same column are connected to different initialization signal lines.

3. The display substrate according to claim 2, wherein different initialization signal lines respectively connected to the first pixel driving circuit and the second pixel driving circuit are configured to be driven independently.

4. The display substrate according to claim 1, wherein the second display region comprises a plurality of dummy rows and a plurality of dummy columns, a plurality of normal rows are arranged between every two adjacent dummy rows and a plurality of normal columns are arranged between every two adjacent dummy columns, the plurality of first pixel driving circuits are located in the plurality of dummy rows or the plurality of dummy columns, and the plurality of second pixel driving circuits are located in the plurality of normal rows and the plurality of normal columns.

5. The display substrate according to claim 4, wherein the plurality of initialization signal lines comprise a first initialization signal line connected to the first pixel driving circuit;

the plurality of initialization signal lines further comprise a second initialization signal line extending along the first direction and connected to the second pixel driving circuit located in a same row.

6. The display substrate according to claim 5, wherein an orthographic projection of a portion of the first initialization signal line extending in the first direction on the display substrate is located in orthographic projections of the plurality of dummy rows on the display substrate; and/or an orthographic projection of a portion of the first initialization signal line extending in the second direction on the display substrate is located in orthographic projections of the plurality of dummy columns on the display substrate.

7. The display substrate according to claim 5, wherein the second display region comprises a first display sub-region located at at least one side of the first display region in the first direction, and at least part of the plurality of first pixel driving circuits are arranged in the first display sub-region;

the first initialization signal line comprises a first sub-portion located at a side of the first display sub-region away from the first display region, a second sub-portion located in the first display sub-region, and a connection portion connecting the first sub-portion and the second sub-portion.

8. The display substrate according to claim 7, wherein the first sub-portion and the second sub-portion extend in the second direction, and the connection portion extends in the first direction; and/or the connection portion and the second initialization signal line are located in a same layer, and the first sub-portion and the second sub-portion are located in different layers from the second initialization signal line; and/or the first sub-portion is located in the dummy column of the first display sub-region away from the first display region, the second subsection is located in the dummy column within the first display sub-region, and the connection portion is located in the dummy row.

9. The display substrate according to claim 8, wherein the second sub-portion is connected to the first pixel driving circuit located in the first display sub-region and located in a same column.

10. The display substrate according to claim 5, wherein the second display region comprises a second display sub-region located at at least one side of the first display region in the second direction, and at least part of the plurality of first pixel driving circuits are arranged in the second display sub-region;

the first initialization signal line comprises a third sub-portion located at an outside of the second display sub-region and a fourth sub-portion extending from the outside of the second display sub-region into the second display sub-region; and the third sub-portion extends in the second direction, and the fourth sub-portion extends in the first direction.

11. The display substrate according to claim 10, wherein the third sub-portion is located in the dummy column, and the fourth sub-portion is located in the dummy row, and/or the fourth sub-portion and the second initialization signal line are located in a same layer; and the third sub-portion and the second initialization signal line are located in different layers.

12. The display substrate according to claim 8, further comprising a data signal line arranged in the normal column and extending in the second direction, wherein the data signal line is configured to apply a data signal to the second pixel driving circuit, and the first sub-portion of the first initialization signal line is arranged in a same layer as the data signal line.

13. The display substrate according to claim 12, wherein the first sub-portion of the first initialization signal line and the connection portion are connected through a via hole, and the connection portion and the second sub-portion are located in different layers and connected through a via hole.

14. The display substrate according to claim 10, further comprising a data signal line arranged in the normal column and extending in the second direction, wherein the data signal line is configured to apply a data signal to the second pixel driving circuit, and the third sub-portion of the first initialization signal line is arranged in a same layer as the data signal line; and/or the third sub-portion and the fourth sub-portion of the first initialization signal line are connected through a via hole.

15. The display substrate according to claim 7, wherein the driving connection line comprises a first driving connection line extending in the first direction, the first pixel driving circuit in the first display sub-region is arranged in the dummy column, and the first pixel driving circuit in the dummy column is connected to the corresponding first light emitting device located in the first display region through the first driving connection line extending in the first direction.

16. The display substrate according to claim 10, wherein the driving connection line comprises a second driving connection line extending in the second direction, the first pixel driving circuit in the second display sub-region is arranged in the dummy row, and the first pixel driving circuit in the dummy row is connected to the corresponding first light emitting device in the first display region through the second driving connection line extending in the second direction.

17. The display substrate according to claim 5, wherein the first pixel driving circuit comprises a first initialization transistor electrically connected to an electrode of the corresponding first light emitting device, so as to be configured to apply an initialization signal to the electrode; the second pixel driving circuit comprises a second initialization transistor electrically connected to an electrode of the corresponding second light emitting device, so as to be configured to apply an initialization signal to the electrode of the second light emitting device.

18. The display substrate according to claim 17, wherein the first initialization signal line is electrically connected to one of a source electrode and a drain electrode of the first initialization transistor, and the other of the source electrode and the drain electrode of the first initialization transistor is electrically connected to the electrode of the first light emitting device; the second initialization signal line is electrically connected to one of a source electrode and a drain electrode of the second initialization transistor, and the other of the source electrode and the drain electrode of the second initialization transistor is electrically connected to the electrode of the second light emitting device.

19. A display device, comprising the display substrate according to claim 1.

20. The display device according to claim 19, further comprising a functional device located on a non-display side of the display substrate, wherein the functional device is configured to emit light to a display side of the display substrate through the first display region and/or receive light transmitted from the display side of the display substrate to the non-display side of the display substrate through the first display region.

* * * * *